(12) United States Patent
Knight et al.

(10) Patent No.: US 10,217,893 B2
(45) Date of Patent: Feb. 26, 2019

(54) METHODS, APPARATUS, AND SYSTEMS FOR PASSIVATION OF SOLAR CELLS AND OTHER SEMICONDUCTOR DEVICES

(71) Applicant: SPECIAL MATERIALS RESEARCH AND TECHNOLOGY, INC. (SPECMAT), North Olmsted, OH (US)

(72) Inventors: Gregory C. Knight, Winchester, MA (US); Horia M. Faur, Medina, OH (US); Maria Faur, North Olmsted, OH (US)

(73) Assignee: SPECIAL MATERIALS RESEARCH AND TECHNOLOGY, INC. (SPECMAT), North Olmstead, OH (US)

( * ) Notice: Subject to any disclaimer, the term of this patent is extended or adjusted under 35 U.S.C. 154(b) by 0 days.

(21) Appl. No.: 15/022,175

(22) PCT Filed: Sep. 16, 2014

(86) PCT No.: PCT/US2014/055933
§ 371 (c)(1),
(2) Date: Mar. 15, 2016

(87) PCT Pub. No.: WO2015/039128
PCT Pub. Date: Mar. 19, 2015

(65) Prior Publication Data
US 2016/0233374 A1 Aug. 11, 2016

Related U.S. Application Data

(60) Provisional application No. 61/929,906, filed on Jan. 21, 2014, provisional application No. 61/878,331, filed on Sep. 16, 2013.

(51) Int. Cl.
*H01L 31/18* (2006.01)
*H01L 31/0216* (2014.01)
*H01L 31/068* (2012.01)

(52) U.S. Cl.
CPC .... *H01L 31/1868* (2013.01); *H01L 31/02167* (2013.01); *H01L 31/02168* (2013.01);
(Continued)

(58) Field of Classification Search
CPC combination set(s) only.
See application file for complete search history.

(56) References Cited

U.S. PATENT DOCUMENTS 6,391,145 B1 5/2002 Nishimoto et al.
7,759,258 B2 7/2010 Du
(Continued)

FOREIGN PATENT DOCUMENTS

CN 102364692 A 2/2012
CN 102610686 A 7/2012
(Continued)

OTHER PUBLICATIONS

Muller et al., "Contact Formation and Recombination at Screen-Printed Local Aluminum-Alloyed Silicon Solar Cell Base Contacts," IEEE Transactions on Electron Devices, vol. 58, No. 10, pp. 3239 to 3245, Oct. 2011.
(Continued)

*Primary Examiner* — Mamadou Diallo
(74) *Attorney, Agent, or Firm* — McDonald Hopkins LLC

(57) ABSTRACT

A method of passivating semiconductor devices using existing tools of junction isolation and phosphosilicate glass (PSG)/borosilicate glass (BSG) etch via room temperature wet chemical growth (RTWCG) processes is provided. Back side processing of the semiconductor device achieves passivation and junction isolation in a single step, while front
(Continued)

side processing achieves passivation, PSG/BSG etch, anti-reflection coating and potential induced degradation (PID) mitigation simultaneously. A modified solar cell fabrication method is then provided by integrating the passivation formation method into conventional solar cell manufacturing systems. The resulting solar cells comprise a semiconductor substrate having a front surface and a back surface. The front surface is coated with a SiOx layer less than 50 nm thick, over which a SiNx layer is deposited. On the back surface, another SiOx layer is coated. Experimental data shows high efficiency and mitigated PID of the solar cells.

29 Claims, 17 Drawing Sheets

(52) U.S. Cl.
CPC ........ *H01L 31/068* (2013.01); *H01L 31/1804* (2013.01); *Y02E 10/547* (2013.01); *Y02P 70/521* (2015.11)

(56) References Cited

U.S. PATENT DOCUMENTS

| | | |
|---|---|---|
| 2007/0169806 A1 | 7/2007 | Fork et al. |
| 2011/0114171 A1 | 5/2011 | Meier et al. |
| 2014/0061531 A1* | 3/2014 | Faur ............ H01L 31/068 252/79.3 |

FOREIGN PATENT DOCUMENTS

| | | |
|---|---|---|
| TW | 201251057 A | 12/2016 |
| WO | 2012036760 A1 | 3/2012 |

OTHER PUBLICATIONS

Equity Solar Demonstrates Substantial Performance Gains From Patented Solar PV Technology; downloaded from http://www.marketwired.com/press-release/equity-solar-demonstrates-substantial-performance-gains-from-patented-solar-pv-technology-1588112.htm; Nov. 16, 2011.
PCT Search Report dated Feb. 19, 2015 in PCT/US2014/055933.
PCT Written Opinion dated Feb. 19, 2015 in PCT/US2014/055933.
Chinese Office Action dated Dec. 20, 2016 for Chinese Patent Application No. 201480062697.3.
European Supplementary Search Report dated Apr. 26, 2017 for EP Application No. 14843436.
Extended European Search Report dated May 4, 2017 for EP Application No. 14843436.

* cited by examiner

METHODS, APPARATUS, AND SYSTEMS FOR PASSIVATION OF SOLAR CELLS AND OTHER SEMICONDUCTOR DEVICES

CROSS-REFERENCE TO RELATED PATENT APPLICATION

This application claims priority to and is a national phase filing under 35 U.S.C. § 371 of PCT/US2014/055933 filed Sep. 16, 2016 and entitled "Methods, Apparatus, and Systems for Passivation of Solar Cells and Other Semiconductor Devices," which itself claims a priority benefit, under 35 U.S.C. § 119(e) to U.S. both U.S. Provisional Patent Application No. 61/878,331, filed Sep. 16, 2013, and entitled "Structures with Reduced Potential Induced Degradation," and U.S. Provisional Patent Application No. 61/929,906, filed Jan. 21, 2014, and entitled "Compositions for Semiconductor Manufacturing, Methods for Using Same and Semiconductor Products Produced Thereby," all of which are hereby incorporated herein by reference in their entireties.

This application also claims a priority benefit, under 35 U.S.C. § 119(e), to U.S. Application No. 61/929,906, filed Jan. 21, 2014, and entitled "Compositions for Semiconductor Manufacturing, Methods for Using the Same and Semiconductor Products Produced Thereby," which application is hereby incorporated herein by reference in its entirety.

BACKGROUND

The solar industry faces two driving demands toward more widespread application: achieving increased efficiency, while lowering manufacturing costs. Since there is usually only a limited amount of space on a roof or land that can be dedicated to solar power installations, relatively minor increases in efficiency across arrays of hundreds of solar cells can add up to major competitive differentiation.

The efficiency of a solar cell, which can be defined as the ratio of the output electrical power of the solar cell to the incident radiant power from illumination by the sun, is limited by a number of factors. First, part of the incident sunlight is reflected away from the solar cell, instead of being absorbed and converted into electricity. For example, the surface of bare silicon reflects nearly 40% of incident light in the infrared region. This reflection loss is further exacerbated by the significant band gaps of materials used in solar cells being largely in the infrared region.

Secondly, even though an incident photon from the sunlight is absorbed and a charge carrier (electron or hole) is generated, recombination can occur before the charge carrier is utilized, thereby introducing recombination losses. In particular, for crystalline silicon (c-Si) cells, the surface represents the largest possible disturbance of the symmetry of the crystal lattice and therefore has a large density of dangling bonds, which are prone to various recombination channels, including radiative recombination, Auger recombination and Shockley-Read-Hall (SRH) recombination.

Thirdly, stable power output from a solar cell over an extended period of time (e.g., 20 years to achieve the expected return) may be impaired by potential induced degradation (PID), which occurs when a solar module's voltage potential and leakage current drive ion mobility within the module between the semiconductor material and other elements of the module (e.g. glass, mount and frame). One theory holds that ions driven by the voltage potential can accumulate on the negatively charged cell surface and interact with p-n junction in a negative manner, thereby reducing the performance of the solar cell.

Passivated emitter and rear cell (PERC), which includes a textured front surface, an anti-reflection coating (ARC) and passivation layers on both front and rear surfaces to suppress surface recombination, may address, at least in part, the efficiency concern for solar cells. The passivation layers in a PERC usually comprise a dielectric material. In industrial practice, the dielectric layer is conventionally formed by thermal oxidation in dry or wet oxygen ambient at temperatures ranging from 900° C. to 1200° C. Chemical vapor deposition (CVD) may operate at relatively lower temperatures, from 200° C. to 900° C., to achieve the coating. These high operation temperatures may induce a variety of problems, including high capital cost, low output or possible damages to the devices that are to be coated. Moreover, the ability of a PERC, in its conventional design, to withstand potential induced degradation (PID) remains to be seen.

SUMMARY

Exemplary embodiments of the invention utilize existing tools in solar cell fabrication technologies to implement room temperature wet chemical growth (RTWCG) processes to facilitate fabricating high efficiency, low-cost PERC solar cells.

In one exemplary embodiment, a method utilizes a junction isolation and phosphosilicate glass (PSG)/borosilicate glass (BSG) etch solar cell processing tool to facilitate fabrication of a passivated emitter and rear solar cell (PERC) via a room temperature wet chemical growth (RTWCG) process. In this method, the back side of a semiconductor substrate is exposed to a first RTWCG solution, contained in a junction isolation process tank of the processing tool, to form a back side oxide layer to passivate the back surface of the substrate. During the same step, the RTWCG solution can also etch away a diffused layer on the substrate edge to achieve junction isolation, and etch away any BSG on the surface. Following the back side processing, the front side of the semiconductor substrate is exposed to a second RTWCG solution, contained in a PSG/BSG etch process tank of the processing tool, to form a front side oxide layer less than 50 nm to passivate the front surface of the substrate. Any PSG/BSG impurity on the front surface of the substrate can also be cleaned by the second RTWCG solution before the formation of the back side oxide layer. After each RTWCG step, the substrate is rinsed using de-ionized (DI) water to remove excessive chemicals on the substrate. The method can further comprise a step to deposit a layer of silicon nitride (SiNx) on the front side oxide layer such that the combination of SiOx and SiNx layers can improve the anti-reflection property and mitigate the potential induced degradation (PID) of the semiconductor device.

RTWCG solutions used in the method comprise an iodine containing compound, a fluoride containing acid, a non-oxidizing acid and water. In one example, the fluoride containing acid is selected to be aqueous hydrofluoric acid ($HF_{(aq)}$) that has a concentration ranging from 2% to 50% to facilitate the etching of the semiconductor substrate. Iodine pentoxide ($I_2O_5$) is employed as the iodine containing compound to promote an oxide reaction to facilitate growth of the oxide layer. The $I_2O_5$ is dissolved in $HF_{(aq)}$ and has a concentration ranging from 0.3 grams per liter (g/L) to 2 grams per liter (g/L).

In another exemplary embodiment, a method of fabricating a passivated emitter and rear cell (PERC) is provided.

The method first creates a texture pattern of inverted pyramids on the front surface of a semiconductor substrate, followed by doping the semiconductor substrate via thermal diffusion, ion implantation or laser-assisted diffusion processes. The doped semiconductor substrate can then be exposed to RTWCG solutions to grow oxide layers on both the front and back surface of the substrate, while junction isolation, PSG/BSG etch, part of anti-reflection coating and PID mitigation can be achieved simultaneously. A layer of SiNx can be deposited on the front oxide layer to further reduce reflection losses and mitigate PID effect. Metal contacts are then screen printed over the SiNx layer on the front side and the back oxide layer on the back side to establish electrical contacts. Via creation can also be included before printing screen contact so as to ensure the electrical communication between the metal contacts and the back side of the semiconductor substrate. Following the screen printing, metal contacts are dried and fired so as to form a bond with the underlying semiconductor substrate.

In yet another exemplary embodiment, a semiconductor device fabricated according to the method described above is provided. The semiconductor device comprises a semiconductor substrate having a front surface and a back surface. The front surface is coated with an oxide passivation layer less than 50 nm thickness, over which a SiNx layer is deposited to reduce optical losses and mitigate PID effect, thereby improving the efficiency and operation stability of the semiconductor device. The back surface of the semiconductor substrate is also coated with an oxide layer to passivate the back surface of the device, further increasing the device efficiency.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Passivated Emitter and Rear Cell (PERC)

Figure 1:
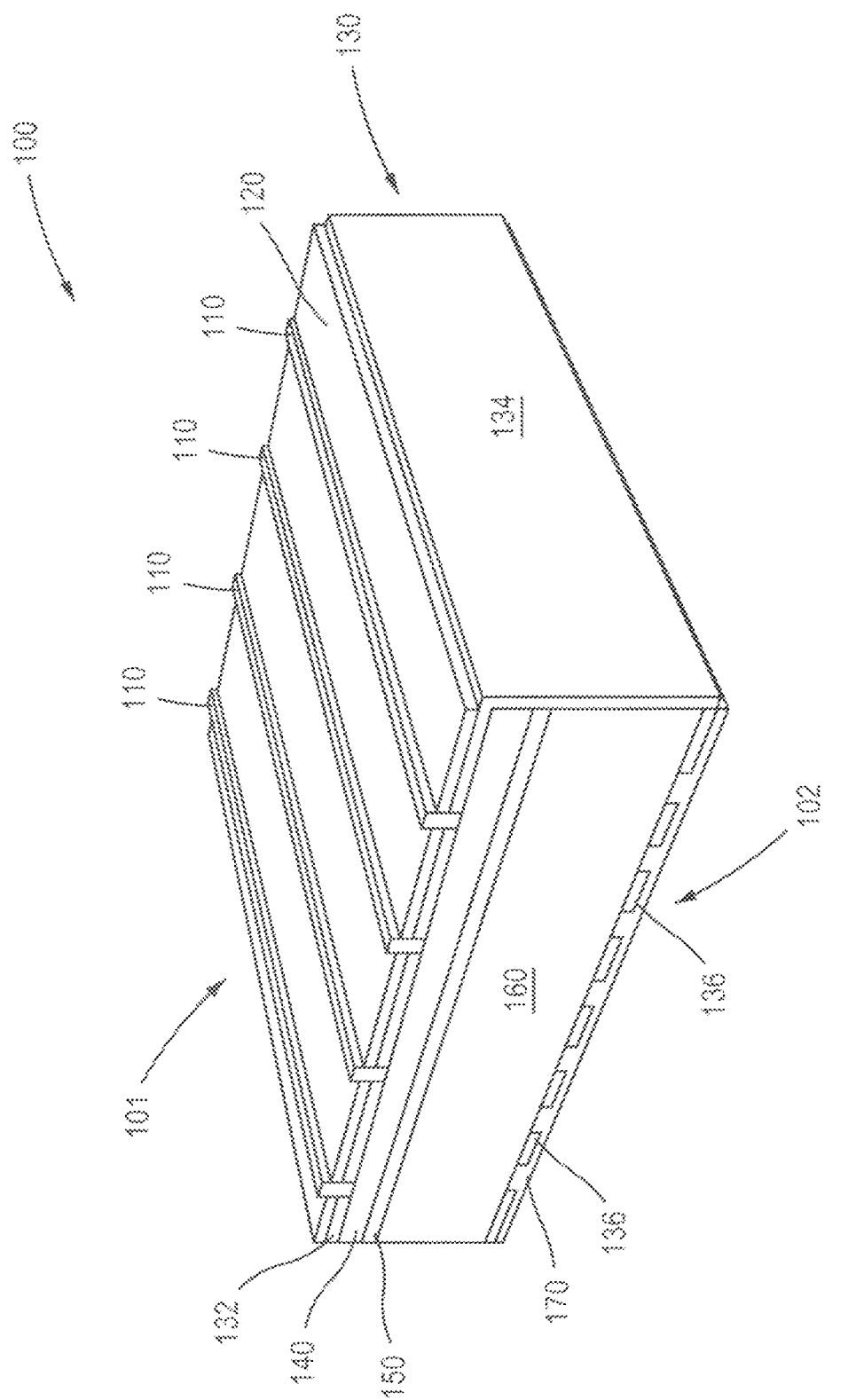
FIG. 1 shows a schematic view of a semiconductor device according to one exemplary embodiment.
Figure 2:
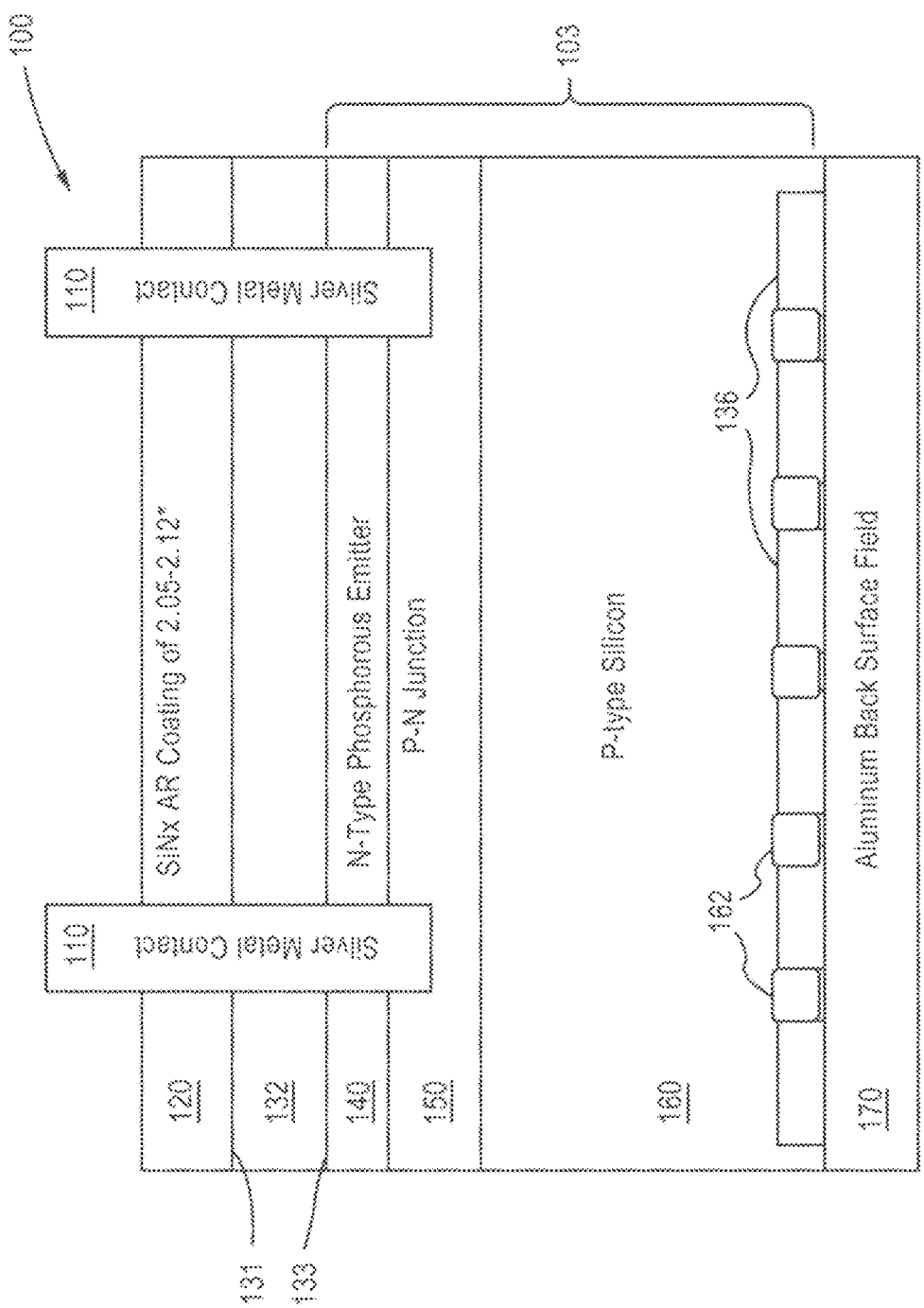
FIG. 2 shows a cross-sectional view of a semiconductor device according to one exemplary embodiment.

FIG. 1 and FIG. 2 show a schematic and cross-sectional view, respectively, of a passivated emitter and rear cell (PERC) 100 according to one exemplary embodiment. The PERC includes a semiconductor substrate 103 that comprises a n-type phosphorous emitter region 140 on the front side 101, a p-type region 160 on the back side 102, and a p-n junction 150 between them. In operation, the front side 101 of the semiconductor substrate 102 is toward incident radiation, which can be direct solar radiation, reemitted radiation from a selective emitter as in a solar thermophotovoltaic (STPV) system, thermal radiation from a heating source, or any other radiation that can be absorbed and converted into electricity by the PERC. In one example, both the front side and the back side can be doped so as to construct bifacial or heterostructure solar cells. Doping materials may include phosphorous, boron or gallium.

On the front side 101 of the semiconductor substrate disposes a front side passivation layer 132 which comprises silicon oxide (SiOx) to passivate the dangling bonds and thereby suppress surface recombination. The thickness of the silicon oxide layer can be from about 2 nm to about 50 nm. A layer of silicon nitride (SiNx) 120 is disposed on the front side passivation layer 132 to improve the anti-reflection property and reduce reflection losses. The silicon nitride layer can be configured to have a refractive index of about 2.0 to about 2.2. The combination of silicon oxide and silicon nitride layers can also help mitigate potential induced degradation (PID) in operation. A plurality of front side metal contacts (fingers) 110 is printed over the SiNx layer 120 but penetrates through both the SiNx layer 120 and the front side passivation layer 132 to reach the emitter region 140 so as to conduct the electricity out of the solar cell for utilities.

The front side 101 can be either smooth (as shown in FIG. 1 and FIG. 2) or textured (Not shown here). In operation, textured surface with, for example, random pyramids can increase absorption due to the increased surface area and decreased chance of light being directly reflected away from the surface. The textures can be created either on the surface of the semiconductor substrate, or on the front side passivation layer 132. In operation, the latter can result in a smaller sheet resistance and therefore increase the efficiency of the solar cell.

On the back side 102 of the semiconductor substrate 103 disposes a back side passivation layer 136, on which a layer of back side metal contact 170 is printed. The back side passivation layer 136 is patterned to have at least one aperture so as to allow the back side metal contact 170 to reach the p-type region 160. The pattern can be created either during the growth of the back side passivation layer 136 or after. For example, a patterned mask that is resistive (not reactive) to the means of growing the passivation layer can be placed over the p-type region 160, such that the back side passivation layer 136 is created only in selected locations. Alternatively, a uniform passivation layer can be created first. Then one or more apertures can be opened by, for example, lasers, etching chemicals, mechanical drills, or other means known in the art.

In addition to the front side passivation layer 132 and back side passivation layer 136, another layer of oxide can be coated on the edge of the substrate 103 to form an edge passivation layer 134. In operation, the edge passivation layer 134 can be produced in the same step in which either the front side passivation layer 132 or the back side passivation layer 134 is produced. Growth of an edge passivation layer 134 can reduce or remove the phosphorous diffusion on the edge of the semiconductor substrate 103 and therefore achieve edge isolation.

A solar cell design that is similar to PERC is passivated emitter with rear locally diffused (PERL) cell, in which the back side 102 of the semiconductor substrate 103 is locally diffused only around the metal contact region 162 (see FIG. 2). In operation, this local diffusion can reduce recombination at the rear while maintaining good electrical contact.

Room Temperature Wet Chemical Growth (RTWCG) Process

The front side, back side and edge passivation layers can comprise silicon oxide (SiOx), which can be produced via a room temperature wet chemical growth (RTWCG) process. A RTWCG process comprises soaking silicon substrates into a growth solution, hereinafter referred to as a RTWCG solution, and creates a silicon oxide layer through chemical reactions in room temperature (e.g. 10° C.-40° C.) between silicon substrates and the RTWCG solution. Since the resulting oxide layer is created by consuming the silicon substrate, a RTWCG process can etch silicon substrates (e.g. to form a selective emitter) and grow oxide layers in a single step.

A RTWCG solution can comprise a mixture of inexpensive liquid Si, C, F, and N precursors, and homogeneous catalysts to increase the growth rate. Non-invasive alkaline solutions can be added into a RTWCG solution to adjust the pH value of the resulting solution. The liquid precursors used can have technical grade purity, e.g. averaging about 99%.

For example, commercial grade 34% $H_2SiF_6$ can be used as one RTWCG solution to grow oxide layer on substrate of silicon or other semiconductor materials. A higher growth rate can be achieved by using commercial grade organic and inorganic silicon sources, a pyridine compound (i.e. N-(n-Butyl) pyridinium chloride), redox aqueous solutions based on $Fe^{2+}/Fe^{3+}$, an organic or inorganic homogeneous co-catalyst, and non-invasive additives including NaF, KOH, $NH_4F$, and $HF_{(aq)}$. Organic components of the RTWCG solution can be substituted with inorganic components to improve dielectric properties of the resulting oxide layer.

A modified RTWCG solution, which can, among others, produce silicon oxide (SiOx) layer on a silicon substrate can comprise a fluoride-containing acidic solution and a reduction-oxidation system that contains one or more elements capable of promoting an oxidation reaction at the silicon surface. The solution provides a balance of etching (to remove the silicon layer) and oxide growth (to deposit a SiOx layer).

More specifically, the RTWCG solution can comprise A % of an iodine containing compound, B % of a fluoride containing acid, C % of a non-oxidizing acid, and D % of water (to form the balance to 100%), where A ranges from about 0.01 to about 0.4, B ranges from about 0.1 to about 10, and C ranges from about 1 to about 50.

The fluoride containing acid can be selected from $H_2SiF_6$, $NH_4F$, HF, NaF, $TiF_6$, $BaF$, $BF_4$ or other metallic and non-metallic fluorides. The RTCWG solution may also include one or more acids, which can also be a fluoride source. Exemplary acids include $H_2SiF_6$, HCl, HF, $HNO_3$, and $H_2SO_4$.

The non-oxidizing acid can comprise one or more of HCl, HI, HBr, HF, $H_3PO_4$, and other acids that do not act as an oxidizing agent. In operation, the non-oxidizing acid associates with and helps to stabilize the iodine-containing compound, or its intermediary or other compound formed by the iodine-containing compound in solution.

In an effort to lower the cost and increase the efficiency and environmental benignity of RTWCG processes, non-metallic catalysts can be utilized to grow SiOx on n+/p c-Si and mc-Si surfaces. Possible catalysts include Group VII Chlorine, Fluorine, Iodine, and Bromine ions in aqueous acidic solutions. For instance, RTWCG SiOx growth solutions can be prepared by dissolving iodine pentoxide ($I_2O_5$) into various concentrations of $HF_{(aq)}$ such that an adjustable speed of oxide layer growth can be achieved. These growth solutions are compatible with the front screen printed metallization of standard crystalline n+/p Si solar cells. The resulting good quality SiOx layers can fulfill at least one or more of the following purposes: reducing surface reflection, passivating the emitter's surface, and produce a good quality selective emitter. All iodine-containing chemical compounds, at our disposal, when dissolved in acidic HF-based solutions can grow SiOx films including, but not restricted to, iodic acid ($HIO_3$), potassium iodide (KI), and $I_2O_5$.

An $I_2O_5$:HF RTWCG solution, when used for solar cell processing, may react with Aluminum (Al) based back screen printed contacts, depending on the screen printing Al paste, sintering temperature, and time. Exposing the Al contacts to the $I_2O_5$:HF RTWCG solution over an extended period of time (e.g. >1 minute) may degrade the Al contacts. Silicon oxide (SiOx) layers can normally passivate the surfaces of silicon substrates with a thickness of 2 nm to about 20 nm, which can be produced in less than a minute at normal growth speed. Therefore, Al contact degradation may not be an issue in this situation. However, the resulting SiOx layer from RTWCG solutions can also function as an anti-reflection coating, which may need a larger thickness (e.g. 100 nm or more) and accordingly longer growth time, thereby inducing potential problems of Al contact degradation.

Mitigation or elimination of potential Al contact degradation may be achieved by using RTWCG solutions with high growth rate so as to shorten the interaction time between the Al contacts and the RTWCG solution. Alternatively, protecting materials can be covered over the Al contacts during the oxide layer growth. Moreover, the Al contacts can be screen printed after the growth of the silicon oxide layer, which can be patterned to have at least one aperture so as to provide electrical communication between the subsequent Al contact and the silicon substrate.

Processing the emitter surface of a solar cell using an $I_2O_5$:HF RTWCG solution can be more straightforward. The cells can float on the growth solution with the emitter face down, or a thin film of growth solution can be applied only on the emitter's surface.

RTWCG SiOx growth solutions can be formulated with varying amounts of $I_2O_5$ dissolved in varying strengths of $HF_{(aq)}$. The $I_2O_5$ concentration can range from 0.3-2 g/L, and the $HF_{(aq)}$ concentration can range from 2%-50%. Without being bound by any theory, SiOx growth rate on the similarly doped n+ silicon surfaces is heavily dependent on the $I_2O_5$ concentration, and to a lesser extent on the concentration of HF utilized. A concentration of 2 g $I_2O_5$/1 L 50% $HF_{(aq)}$ can create a 130 to 150 nm-thick metallic blue oxide in about 15 seconds. A concentration of 0.3 g $I_2O_5$/1 L 10% $HF_{(aq)}$ can grow the same SiOx thickness in 5 minutes.

Besides $HIO_3$, $I_2O_5$, and KI, there exists a relatively large number of iodine containing chemicals that can be used to produce improved quality RTWCG SiOx layers for solar cells and other applications. This list includes, but is not restricted to: $BI_3$, $I_2O_4$, $I_2O_5$, $I_2O_9$, $IF_5$, $SiI_4$, $PI_3$, $P_2I_4$, $TiII_4$, $VI_3$, $CoI_2$, $NiI_2$, $AsI_3$, $SnI_4$, $SbI_3$, $TeI_4$, $PbI_2$, and $BiI_3$. Various combinations of one or more iodine containing chemicals dissolved in $HF_{(aq)}$ can catalyze or co-catalyze the SiOx layer formation.

The above catalysts when added to several SiOx growth solution described herein, can also increase the quality of RTWCG layers grown on substrates made of other materials. For example if $AsI_3$ is added to a VT RTWCG growth solution, the passivation capability of the RTWCG Ga—As—O thin film grown on p-GaAs and n-GaAs substrates can significantly increase. Here the VT RTWCG growth solution comprises 1 to 3 volume parts of 60% $H_2TiF_{6(aq)}$ and 1 to 3 volume parts of 1-5 g $V_2O_5$ dissolved in 1 L 10% $HCl_{(aq)}$.

A RTWCG solution may also contain one or more noninvasive additives, such as $NH_4F$, HF, HCl, $HNO_3$, $H_2O_2$, or a silica source, such as colloidal silica, $SiO_2$ and other soluble metal silicates. These additives can be utilized, among other uses, to adjust the chemical composition, to adjust the pH of the growth solution, to adjust the resulting oxide layers' metallic and nonmetallic impurity concentration so as to reduce optical and electrical losses, to vary the growth rate, and to adjust the rate at which the nonmetalized emitter's surface is etched back.

In order to create preferred RTWCG SiOx growth solution formulations for the silicon solar cell application, the RTWCG SiOx growth solution formulations included various metallic ions $Me^{+n}/Me^{-(n+m)}$ where n is from 0 to 4, and m is from 1 to 4. Some metallic or nonmetallic ions that have been successfully used to enhance the growth rate of the growth solution, and/or lower the level of metallic concentration in the oxide include but are not limited to: Ti, Co, V, Cr, Ni, Sr, Cu, Ce, Y, Zr, Nb, Ru, Rh, Fe, Ba, Pb, Pd, I, Br, Al, Sb, Be, Bi, Hf, Ta, W, La, Ir, Os, As, Sn, Ag and Mg. A function of the various metallic ions is as redox components, for example, $K_3Fe(CN)_6$ forms the $Fe^{2+}/Fe^{3+}$ redox system. Other metallic ions can act as homogeneous oxidation catalyst components that increase the growth rate of the RTWCG SiOX thin film.

RTWCG formulations that can produce high quality SiOx layers can be substantially free of a silicon source, i.e. silicon elements in the resulting layers almost exclusively come from silicon substrates on which the oxide layer is produced. By "substantially free" of a silicon source, it is meant that there is no significant level of silicon source in the RTCWG solution. In particular, a silicon source is not intentionally added, and the solution does not contain a silicon component. Trace silicon levels do not detract from the silicon free quality of the RTCWG solutions, as it is recognized that trace impurities may be difficult to remove and do not affect the function of the solution. By trace levels, the silicon levels are less than 1%, or less than 0.1% by weight. Elimination of silicon source components from the RTWCG solutions can result in increased SiOx growth rates with sufficient etch back depths to form excellent quality selective emitters that preserve the integrity of the screen printed front and back contacts, and a reduction in the resulting SiOx film's metallic impurities concentration.

Replacing organic components in RTWCG solutions by inorganic components can further improve the quality of the resulting oxide layers by reducing the metallic impurities. For example, a RTWCG solution comprising 5 volume parts of 34% $H_2SiF_{6(aq)}$, 1 volume part of 60% $H_2TiF_{6(aq)}$, and 1 volume part of 5% $K_3Fe(CN)_{6(aq)}$ can produce SiOx layers with negligible Fe impurity and therefore creating good electrical and dielectric properties for solar cell applications.

In addition to producing oxide layers, RTWCG processes can also produce conductive layers for applications including, but are not limited to, manufacturing highly efficient low-cost thin film solar cells. RTWCG solutions for conductive layer production can comprise metallic nitride such as Bi, Ti, Co, Cu, Se, and Ce to create films with high Si—O-M (e.g. Si—O—Cu, Si—O—Bi, Si—O—Se) concentrations, where M is metal. Metallic chlorides and fluorides selected from the group consisting of Bi, Ti, Co, V, Ce, Al, La, and Mg based chlorides and fluorides can also be included to promote formation of conductive layers.

The resulting conductive layers from RTWCG processes can be transparent in the visible region of the solar spectra, and have a relatively low average weighted reflection (AWR) of roughly 10%. Si—O-M layers may be used as a higher quality, lower cost, replacements of known transparent conductive oxides (TCO) in the art. Without being bound by any theory or mode of operation, RTCWG solutions containing these compounds appear to be capable of processes similar to electroless plating, which allows the formation of metal in the SiOx layer.

Silicon oxide layers created via RTWCG processes are composed of Si—O-x where Si is silicon, O is oxygen, and x can be nitrogen, carbon, fluoride, or hydrogen. The films can also include trace levels of Si—O-M where M is a metallic ion. The bulk of the trace metal can be either oxidized, or bonded to Si, N, and other non-metallic trace impurities according to composition analysis of the sample via, for example, X-ray photoelectron spectroscopy (XPS) analysis.

Using RTWCG solutions comprising redox systems, aqueous homogeneous oxidation catalysts, and non-invasive inorganic additives, non-oxidized metals are of only trace amount and exist only at the surface of the layers, according to XPS analysis of various peaks. This surface impurities can be further lowered by, for example, a short etching step in diluted $HF_{(aq)}$. Furthermore, nearly 100% of the impurities found in the SiOx bulk region form stable compounds with nitrogen, silicon or oxygen. This observation holds true for RTWCG SiOx films grown on Si as well as all other studied substrates such as GaAs and other semiconductor substrates from groups IV, III-V, III-VI.

Figure 3C:
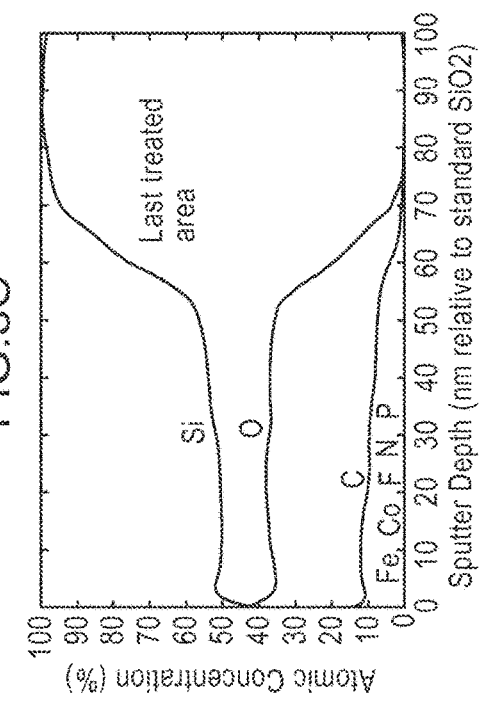
FIG. 3A-3C show measurements of compositions along the depth of oxide layers created by RTWCG processes.
Figure 3A:
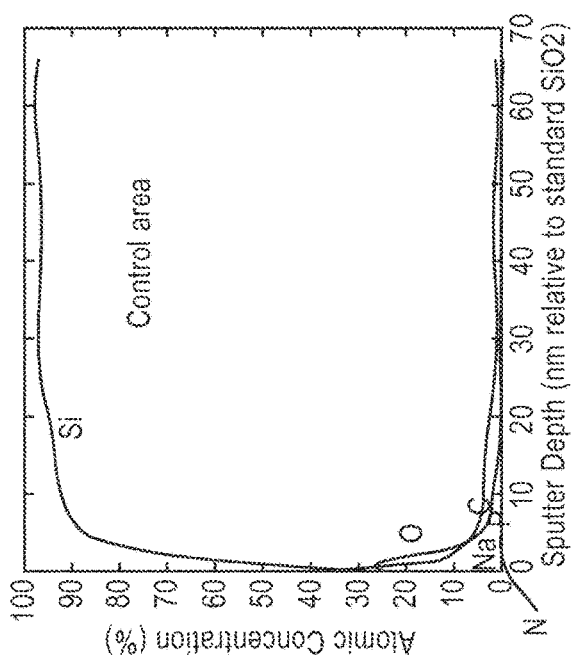
Figure 3B:
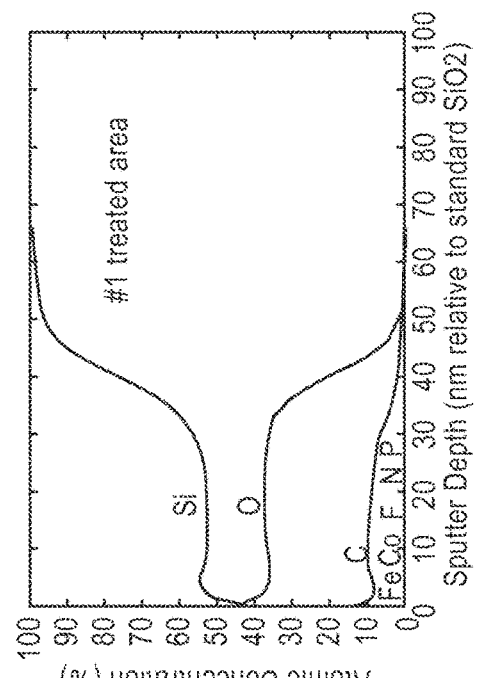

FIG. 3A-3C show composition profiles along the depth of sample silicon oxide layers created by RTWCG processes in different areas of a silicon substrate. FIG. 3A shows a control area where only about 3 nm of silicon oxide is created. FIGS. 3B and 3C show a first treated area of about 40 thick, and a last treated area of about 60 nm thick, respectively.

As indicated by FIG. 3A-3C, both silicon and oxygen elements have a graded profile along the depth of the oxide layers. On the surface, silicon and oxygen have substantially the same atomic concentration. The silicon-oxygen ratio then increases toward the SiOx/Si interface until a plateau region that is approximately 5 nm beneath the surface. The depth of the plateau region depends, at least in part, on the growth time and the formulation of the RTWCG solution used for the growth. Within the plateau region, the silicon-oxygen ration maintains at a substantially stable level of about 1.4±0.2. Beneath of the plateau region, the silicon-oxygen further increases until the oxygen concentration decreases to trace levels.

One consequence of the graded composition profile can be a graded refractive index profile, which may reduce reflection losses and improve passivation effect. Due to the distinct refractive index between silicon and oxygen, the surface of the oxide layer can be fabricated to have a refractive index around 1.2-1.3, while the refractive index near the SiOx/Si interface can reach 3.4-3.5.

Several metallic or non-metallic impurities, such as Fe, Ce, F, N and P, also appear on the composition profiles, but they are all of trace levels and therefore do not tend to influence the optical, dielectric or electrical properties of the oxide layers in a significant way. Moreover, XPS analysis indicates that these impurities predominantly concentrate on the surface of the oxide layers and therefore can be removed by an additional etching step using HF acid. In operation, low concentrations of impurities may also enhance the suppression of surface combination by eliminating the dangling bonds on the surface of the silicon substrate.

Advanced Passivation Platform Converted from PSG/BSG Etch and Junction Isolation Tools for Solar Cell Fabrication Wet chemical etching processes represent a standard procedures in nowadays batch or inline based production lines for crystalline silicon solar cells. For example, before doping silicon substrates, SC1 or $O_3$ can be used for removing organics, while HCl, HF, $O_3$, or $H_2O_2$ can be used to remove metal impurities.

Diffusing silicon substrates can result in a layer of phosphosilicate glass (PSG) grown on the surface of the substrate. The PSG layer may act as a constant source of dopants for subsequent diffusion steps, thus fixing the surface concentration of the phosphorus doped areas to the solid solubility limit. Accordingly, PSG etch can be an important step in fabricating high efficiency solar cells and may be achieved by HF or $NH_4F$ etching. Boron doping may result in a layer of borosilicate glass (BSG), which can be removed in similar ways.

During the diffusion process, phosphorus not only diffuses into the desired front surface but also on the edges and the rear surface, creating a shunting path between the solar cell front and rear. For this reason, various edge isolation techniques have been devised, including plasma etching, and laser cutting. As a standard practice, edge junction isolation, or the removal of the path around the wafer edge, is commonly done by 'coin stacking' the cells. The stacked cells are then placed inside a plasma etching chamber to remove the exposed edges. However, stacking and un-stacking in these isolation techniques may lead to a strong disruption in the process flow, increasing manufacturing cost. Alternatively, inline process of junction isolation, without the steps of stacking and un-stacking, can be achieved via a wet chemical etching step, in which mixtures of HF, $HNO_3$ and $H_2O$ are utilized to etch away a diffused layer.

Moreover, solar cells can have a textured surface to improve the conversion efficiency. In addition to reduced reflection losses, light-trapping of long wavelength light can also be desirable, especially for thinner wafers or ribbon materials. While monocrystalline silicon can be easily textured by alkaline solutions, texturing of multicrystalline (mc-Si) comprising grains with different orientation more difficult. One promising technique can be porous silicon (PS) formation, which can be achieved by etching silicon wafers in diluted nitric and hydrofluoric acid at room temperature to produce an appropriate porous surface layer.

Existing tools to implement wet chemical etching for solar cell fabrication, more specifically for junction isolation, PSG etch and/or porous silicon etch normally comprise: a junction isolation process tank, a first rinse station, a porous silicon etch process tank, a second rinse station, a PSG etch process tank, a third rinse station and a dry station. Each process tank can be coupled to one or more chemical reservoirs. For instance, the junction isolation process tank can be coupled to a HF reservoir, a $HNO_3$ reservoir and a $H_2SO_4$ reservoir. Additional reservoirs to contain water may also be included. The porous silicon etch process tank can be coupled to chemical three reservoirs for HF, $HNO_3$ and $H_2O$, or KOH, isopropyl alcohol (IPA) and $H_2O$. The PSG etch tank can be coupled to a HF reservoir.

One or more chemical dosing units can be placed between the process tanks and the chemical reservoirs to control and monitor the amount, pressure and/or flow speed of the chemicals so as to optimize the etching process. Rinse stations in the above tools can use de-ionized (DI) water or ultrapure water to clean silicon substrates after each etching step.

The dry station can use hot air or nitrogen to dry silicon substrates after rinsing. Alternatively, more advanced surface tension gradient drying technique can also be used. The surface tension gradient drying, or Marangoni drying, can utilize a volatile organic compound (e.g. alcohol or IPA) with a lower surface tension than water that is introduced in the vicinity of the substrate as it is slowly withdrawn from the water. As the small quantity of the volatile compound vapor comes into contact with the refreshed water meniscus, it dissolves into the water and creates a surface tension gradient, which causes the meniscus to partially contract and assume an apparent finite angle. This causes the thin water film to flow off the substrate, thereby drying the substrate. Moreover, the Marangoni drying can also remove contaminants and particles during the drying process.

Figure 4:
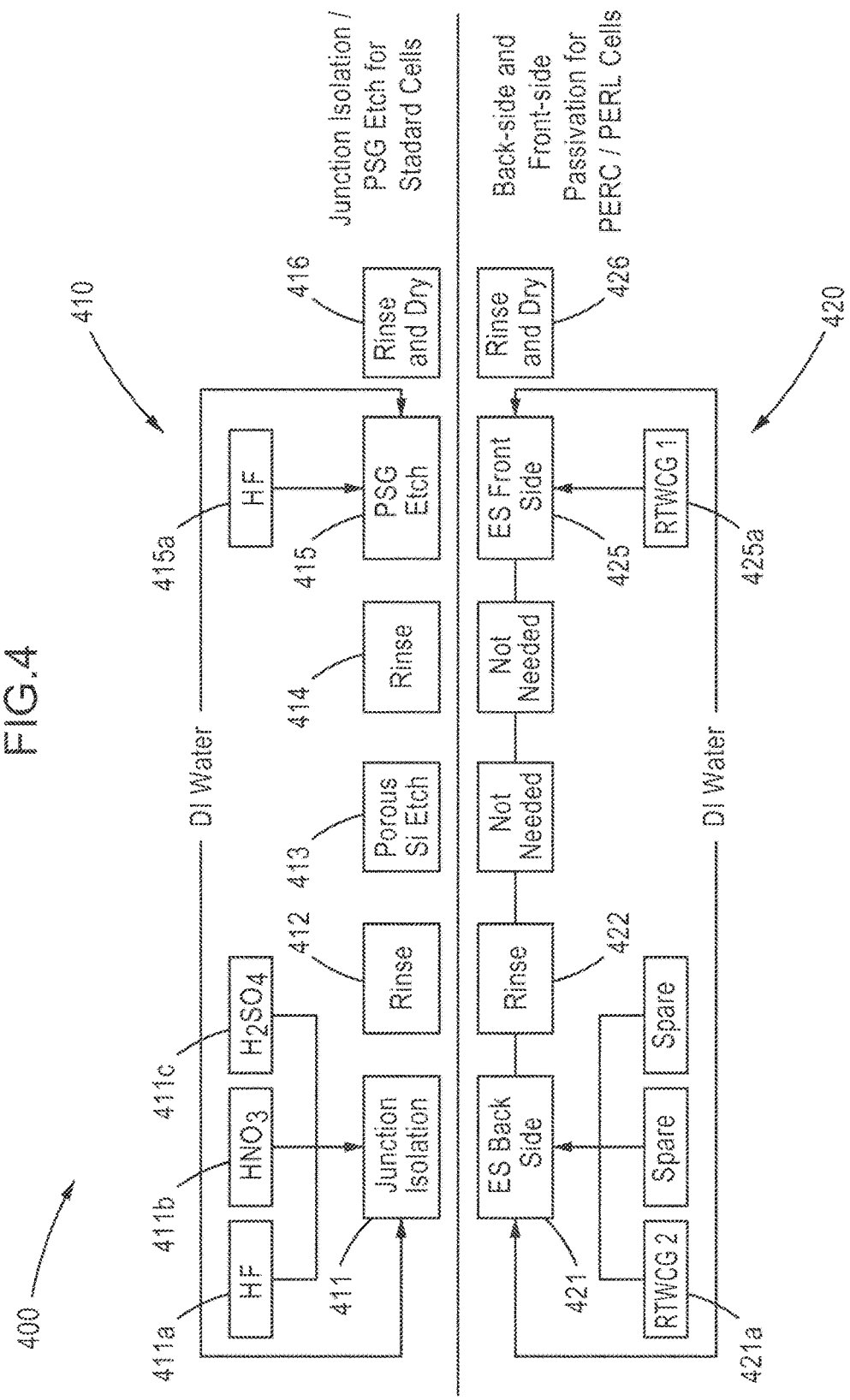
FIG. 4 shows a method of passivation layer formation using existing tools of junction isolation and PSG/BSG etch.

In operation, a conventional junction isolation and PSG etch process 410 for solar cells, as shown in FIG. 4, may comprise the following steps. In step 411, a silicon substrate for solar cell fabrication can be exposed to a chemical solution for junction isolation. The chemical solution can be delivered from chemical reservoirs 411a-411c that contain HF, $HNO_3$ and $H_2SO_4$, respectively. Step 412 rinses the junction isolated substrate by removing excessive chemicals on the substrate, preparing the substrate for step 413, in which a porous silicon etch takes place to create textures on the front surface of the substrate. A second rinse then cleans the textured substrate in step 414, followed by a PSG etch step 415 to remove any PSG on the surfaces of the substrate via use of HF from the chemical reservoir 415a. Another rinse and dry step 416 then cleans the substrate and dries it for further processing, such as metallization.

The above tools for solar cell processing can be retrofitted and utilized, as shown in FIG. 4, to implement RTWCG processes for producing passivation layers, while at the same time realizing junction isolation, PSG etch, anti-reflection coating, and porous silicon etch, among others. This modified method 420 can simplify fabrication steps for solar cells and accordingly reduce manufacturing costs.

More specifically, the junction isolation unit, which generally comprise a junction isolation process tank and a plurality of chemical reservoirs to contain HF, $HNO_3$ and $H_2SO_4$, can be configured to passivate the back side of silicon substrates, in addition to junction isolation. A RTWCG solution can be placed in one of the plurality of chemical reservoirs to grow a silicon oxide layer on the back side of silicon substrates for passivation. Since the RTWCG solution can also react with the edge of the silicon substrate, a layer of diffused silicon can be etched away and a new layer of silicon oxide can form on the substrate edge, thereby achieving efficient edge isolation.

The PSG etch unit, which generally comprise a PSG etch process tank and a reservoir for HF, can be configured to passivate the front side of silicon substrates, in addition to PSG etch, anti-reflection layer coating and porous silicon etch. The HF in the chemical reservoir can be replaced by a RTWCG solution to grow the silicon oxide layer on the front side of silicon substrates for passivation. Since the growth of silicon oxide layer normally starts when the RTWCG solution comes in contact with a clean silicon surface, the solution can also be utilized for PSG etch.

Moreover, the RTWCG solution can also create a textured front surface for solar cells in the same step of passivating the front side, thereby eliminating the need for additional porous silicon etch. Instead of texturing the silicon surface as in conventional solar cell fabrication processes, the RTWCG method, according to one exemplary embodiment, can create textures on the oxide layer surface while preserving the smoothness of the silicon surface. A textured oxide surface can be formed during the growth step under high growth rate conditions, e.g., >200 nm/minute. The texture process can also be carried out using additional (10-15 seconds) mild acid wet process step after the growth of the SiOx layer.

Solar cells with smooth silicon surface but textured oxide layers can have several advantages, such as reduced front surface recombination velocity and a higher level of front surface passivation due to a less damaged silicon surface and reduced silicon surface area. Furthermore, these solar cells can also have a higher efficiency because of a decrease in the emitter sheet resistivity loss, lower contact resistance, higher shunt resistance, and a lower diode ideality factor.

The resulting oxide layer can also function, at least in part, as an anti-reflection coating (ARC) to help solar cells retain the incident solar energy. In one example, the SiOx layer alone may achieve an AM 1.5 average weighted reflectance (AWR) in the range of 6% to 9% due to its graded refractive index. In another example, the SiOx layer may be part of a multi-layer ARC, which can also include a silicon nitride (SiNx) of larger refractive index.

In operation, a method 420 of facilitating fabrication of a passivated emitter and rear solar cell (PERC) via a room temperature wet chemical growth (RTWCG) process using existing solar cell processing tools can start from a diffused silicon substrate. In step 421, at least a portion of the silicon substrate can be placed in the junction isolation process tank to allow contact between the portion of the silicon substrate and a RTWCG solution delivered from a chemical reservoir 421a. The chemical reservoir 421a can be selected from any one of the chemical reservoirs 411a-411c. Chemical reaction between silicon and the RTWCG solution can create a back side passivation layer comprising silicon oxide (SiOx). At the same time, chemical reactions between the substrate edge and the RTWCG solution can also remove a diffused layer, thereby achieving junction isolation. Following the RTWCG processing on the back side in step 421, the silicon substrate can be rinsed in the first rinse station during step 422 before being sent to the PSG etch tank, in which the front surface of the silicon substrate can be processed via a second RTWCG step 425. The second RTWCG step 425 can produce a front side oxide layer and fulfill one or more of the following purposes: cleaning the silicon substrate by removing any PSG layer, passivating the front side, and forming at least a portion of an anti-reflection coating. The second RTWCG solution, which can be delivered from a chemical reservoir 425a converted from the chemical reservoir 415a in the solar cell processing tool, can be further configured to create a textured surface on the oxide layer by using high growth rate solutions, or briefly exposing the front passivated silicon substrate to an etching solution, such as HF. In step 426, a third rinse station can then clean the silicon substrate by removing excess RTWCG solutions, followed by a dry station to remove excessive water introduced by the previous rinse step.

The overall growth speed of SiOx layer is a balance of two competing reactions: etching back of the silicon substrate, and growth of SiOx via surface reaction. As used herein, SiOx thickness refers to the final SiOx thickness of the layer. SiOx growth rate refers to the total SiOx thickness generated over a unit of time (typically 1 minute). The growth of a given SiOx thickness typically will consume a larger thickness of the initial silicon substrate, so that the total SiOx layer grown is less than the Si etch back. By way of example, in the formation of a 100 nm SiOx layer, 150 nm of Si can be consumed.

The overall growth speed of the above method may be tuned either by the composition of the RTWCG solution used for processing, or by the temperature at which the chemical reaction occur. On the solution composition side, for example, in a RTWCG solution containing HF, HCl, iodine source and water, increasing the iodine-containing compound can increase the growth rate, while the HF has minimal effect on growth in the 6% to 50% range. In another example where the RTWCG solution contains HF, $HNO_3$ and iodine source, lowering $HNO_3$ or HF concentration can lower both growth speed and etch back speed. On the temperature side, increasing the reaction temperature can increase reaction speed in general. Therefore, a variable growth speed during solar cell fabrication can be achieved if desired.

Converting existing tools in solar cell processing to an advanced passivation platform for PERC or PERL cells as described in the above exemplary embodiment can have several advantages. First of all, the conversion involves almost no modification of existing systems and therefore requires nearly zero capital expenditure (CAPEX).

Moreover, the converted system can fulfill several purposes in a single step. For example, the back side passivation can simultaneously remove phosphorous diffusion on the substrate edge and achieve junction isolation, and the front side passivation can concurrently create at least a portion of anti-reflection coating (ARC), remove any PSG on the substrate surface and texturize the front surface of the resulting solar cell to increase efficiency. This simplifies the fabrication process for solar cells by eliminating at least the use of extra chemical reservoirs in the junction isolation unit, and the silicon porous etch process tank and the associated rinse station. The method also renders unnecessary several thermal steps that are normally part of a fabrication process when silicon oxide layers are thermally diffused.

The converted advanced passivation platform can also be more efficient than previous passivation systems such as dry/wet deposition systems and thermal/chemical growth systems. More specifically, the advanced passivation platform can produce oxide layers within a wide range of thickness, for example, from about 2 nm to hundreds of nanometers depending on the application of the oxide layers. The growth speed of the advanced passivation platform can also vary in a wide range—from a few nanometers per minute up to as high as 500 nanometers per minute—depending at least in part on the composition of the RTWCT solution or operation temperature. The resulting oxide layers can have excellent passivation effect and extend the lifetime of charge carriers so as to improve the solar cell efficiency.

Comparing to other methods of passivation layer fabrication, the passivation system according to exemplary embodiments of the invention can have a wider thickness range than both thermal and chemical growth systems, a better passivation effect than wet deposition technique, a lower CAPEX than dry deposition technique, and a shorter process time than thermal growth method. In summary, the advanced passivation system can reduce overall manufacturing cost by streamlining the process and eliminating several steps and modules. The system can also improve environmental friendliness by eliminating at least one rinse station (save water) and several thermal steps (save electricity or gas).

Figure 5:
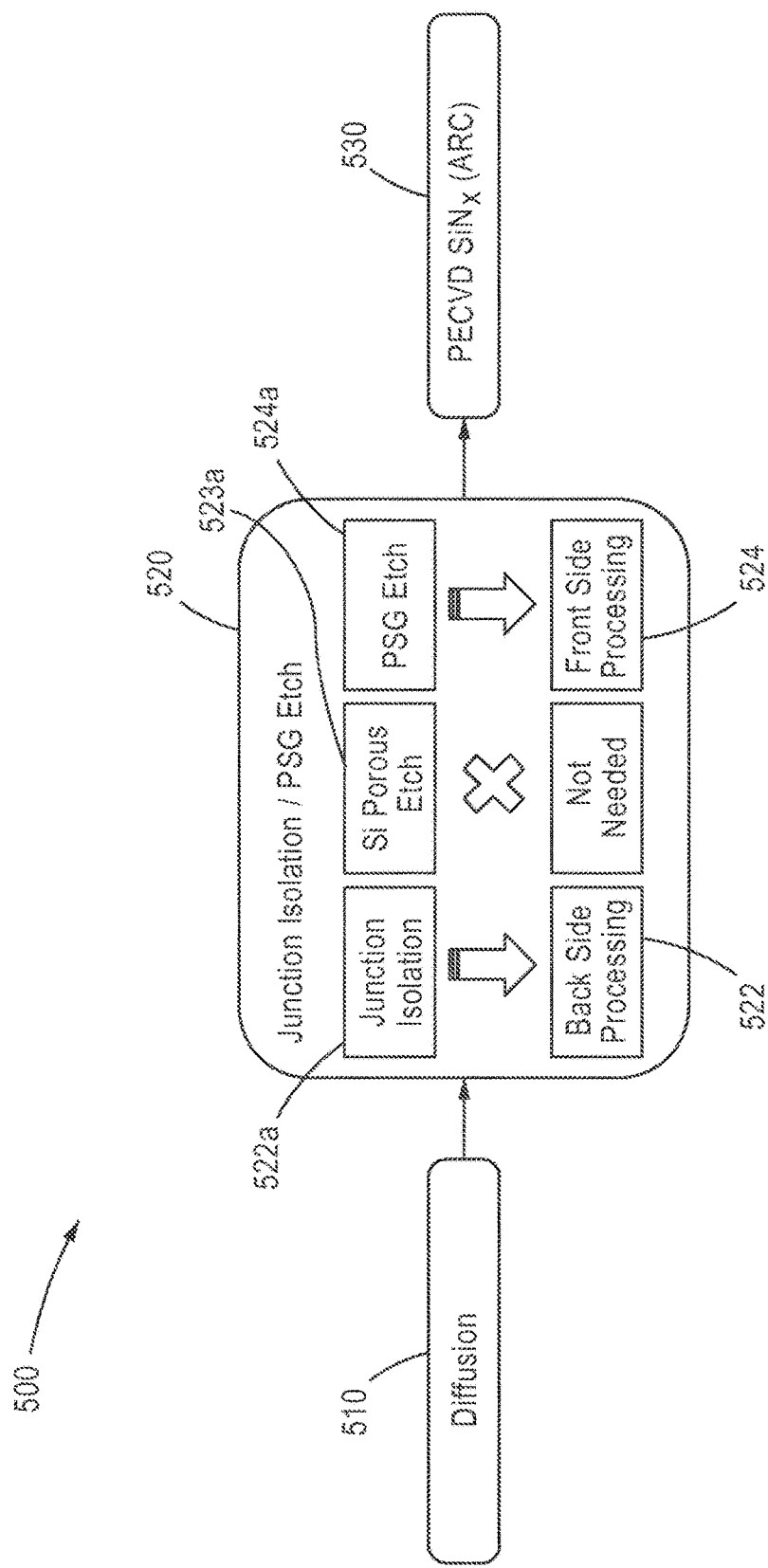
FIG. 5 shows an input and output system for a passivation layer formation method like the one shown in FIG. 4.

FIG. 5 shows an input and output system 500 for an advanced passivation platform like the one shown in FIG. 4. On the input end, a semiconductor substrate can be thermally diffused in step 510 with doping materials before being sent to the advanced passivation platform for back side and front side processing as in step 520. Alternatively, the doping materials may be introduced into the substrate via ion implantation, laser-assisted doping, or other means known in the art. On the output end, the passivated substrate can be delivered for additional coatings. In one example, a layer of silicon nitride (SiNx) can be deposited over the front side oxide layer via a plasma enhanced chemical vapor deposition (PECVD) process to further improve the anti-reflection property of the resulting solar cell.

Low-Cost and Easy-to-Implement Process of Fabricating Highly Efficient Solar Cells Via RTWCG Processes One more advantage of the passivation method via RTWCG processes is its compatibility with conventional screen printing metallization that creates front and back electrical contacts. The RTWCG process permits the use of screen printing pastes which offer lower contact resistance and more conductive front grid contacts. As a result, the advanced passivation system that implements the passivation method can be conveniently integrated into conventional solar fabrication systems.

Figure 6:
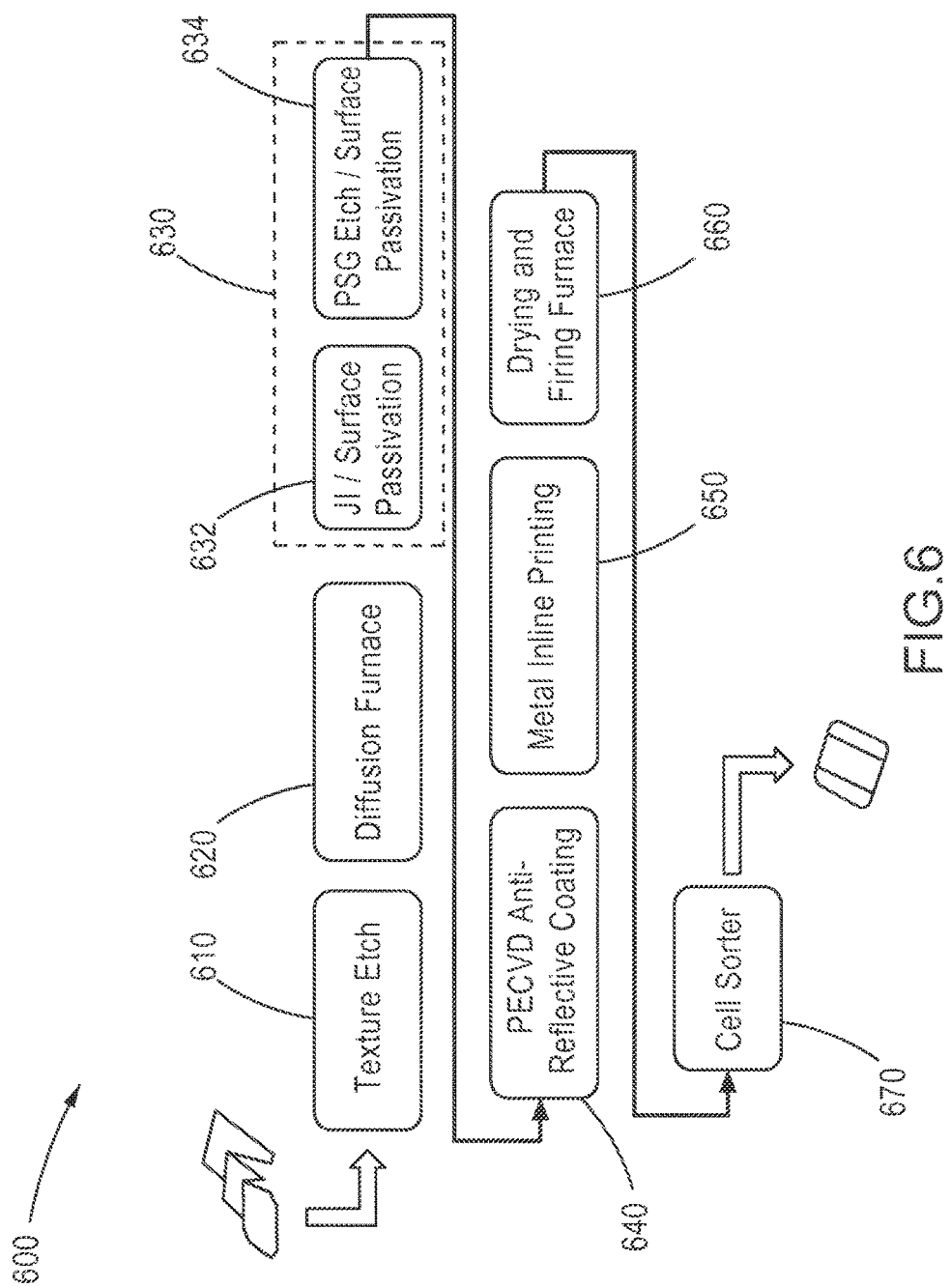
FIG. 6 shows a method of fabricating solar cells of high efficiency and low PID according to one exemplary embodiment.

Considering that the advanced passivation system can: (i) in-situ chemically clean the silicon substrate surfaces, including the metalized surfaces making them interconnect ready, (ii) produce a graded index of refraction SiOx that passivates the surfaces and has a low AM1.5 average weighted reflectance, (iii) create textures on the front surface of the resulting solar cell to improve efficiency, a modified fabrication method 600 for passivated emitter and rear cells (PERCs) can comprise steps as shown in FIG. 6.

The first step 610 can be texturing a semiconductor substrate by creating a plurality of inverted pyramids on the front surface of the semiconductor substrate. The inverted pyramids can be either periodic or random and can be produced by a KOH/isopropanol solution. Alternatively, a photolithography method can be utilized to create the inverted pyramid pattern. In operation, the inverted pyramid structure can decrease optical losses due to reflection. Moreover, due to the minimized contact area between the metal contacts and the silicon substrate, electrical losses can also be reduced by this inverted pyramid structure.

Following the surface texturing, in step 620, the semiconductor substrate can be doped, or diffused with, for example, phosphorous on the front side as is well known in the art. Alternatively, both the front side and the back side can be doped so as to construct a bifacial or heterostructure solar cell. Doping materials may also include boron or gallium, in addition to phosphorous. A variety of techniques can be employed here. For example, a phosphorous coating can be applied to the surface, and the coated substrate can be put in a belt furnace to diffuse a small amount of phosphorous into the substrate. In another example, doping the semiconductor substrate may be achieved via an ion implantation process, in which ions containing doping materials are accelerated and fired into the substrate.

Doped semiconductor substrates can then be exposed to a first RTWCG solution in step 632 for back side processing, including junction isolation and back side passivation layer formation, followed by front side processing in step 634 to remove PSG impurities on the front surface and create an oxide layer for passivation and anti-reflection coating. This step 630 can be implemented by an advanced passivation system converted from existing tools for solar cell fabrication, more specifically for junction isolation and PSG etch.

Passivated semiconductor substrate can then be coated with a layer of silicon nitride (SiNx) on the front side to create an anti-reflection coating (ARC) via a plasma enhanced chemical vapor deposition (PECVD) in step 640. In one example, the SiNx layer alone can function as an ARC layer. In another example, the SiNx and the oxide layers together form an effective ARC layer.

One or more metal contacts can be screen printed in step 650 on semiconductor substrates with ARC layers to conduct electricity generated by the solar cells. As is well known in the art, the front side metal contact can comprise silver (Ag), while Aluminum (Al) is commonly used on the back side. Screen printing method and the metal pasted used therein are compatible with RTWCG solutions for oxide layer formation, thus the screen printing step and the passivation step via RTWCG processes may be arranged in arbitrary orders.

Figure 7:
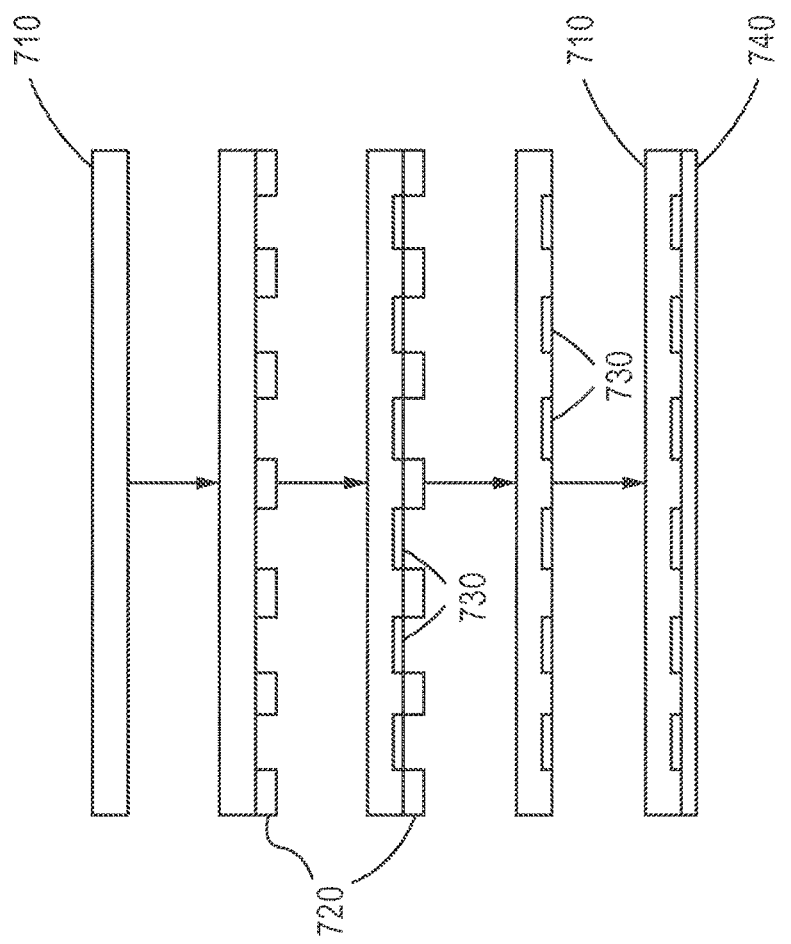
FIG. 7 shows a method of back side processing using RTWCG processes according to one exemplary embodiment.

One or more via can be created to facilitate the back side screen printing and ensure that the printed metal contact can have electrical contact with the semiconductor substrate beneath the back side passivation layer. One way for via creation is shown in FIG. 7. A semiconductor substrate 710 can be covered with one or more resist dots 720 over its back surface. The resist dots can be created by manually stamping, or photolithography techniques, in which a resist film is spin coated onto the surface, followed by selective etching using a radiation. RTWCG processes applied on the back side covered by resist dots can then create a patterned oxide layer 730, which is disposed only in areas not covered by the resist dots. Removing the resist dots 720 can therefore expose the semiconductor surface on the back side for screen printing. The resulting metal layer 740 from screen printing can accordingly have electrical contact with the semiconductor surface at least in locations where the resist dots are placed. In this exemplary embodiment, the metal contacts are non-fire through, but fire-through contacts may also be used.

Following the screen printing of metal contacts in step 650, the semiconductor substrate can be placed in one or more furnaces for drying and firing in step 660. More specifically, the metal paste can first be dried at about 150° C. to remove much of the solvents, which may cause excessive out gassing and lead to cracks and voids. The dried substrates are then fired inside a firing furnace that can further decomposed into four steps. The first step is the initial temperature ramp up where the paste solvents are volatilized. The second step is the burn out, which can remove substantially all of the organic binder used in paste formation at 300-400° C. The third step is the sintering, or the firing process, which can be done between the ranges of 700-800° C. in a furnace. During this process, the metal forms a bond with the underlying semiconductor substrate to form metal contact. The final step in the drying and firing process is the cool down phase.

Solar cells after drying and firing step 660 can then be sorted according to, for example, their electrical performance in step 670. Simulated sunlight, provided by a pulsed xenon lamp with an optical filter to produce a close match to the air mass 1.5 global solar spectrum, can be used for the testing of electrical performance.

The modified solar fabrication process can be further modified to produce passivated emitter and rear locally (PERL) diffused cells. In this process, only areas that would have electrical contacts with the back side metal contact are doped with boron. The rest of the process can be substantially similar to the above described process.

Solar cells created by the modified fabrication process described above can have a variety of advantages as shown in FIG. 8 to FIG. 17. These advantages include, among others, long lifetime of charge carriers (good passivation), high open circuit voltage, mitigated potential induced degradation (PID), high quantum efficiency (QE), low reflection loss, high short circuit current and high fill factor (FF).

Figure 8:
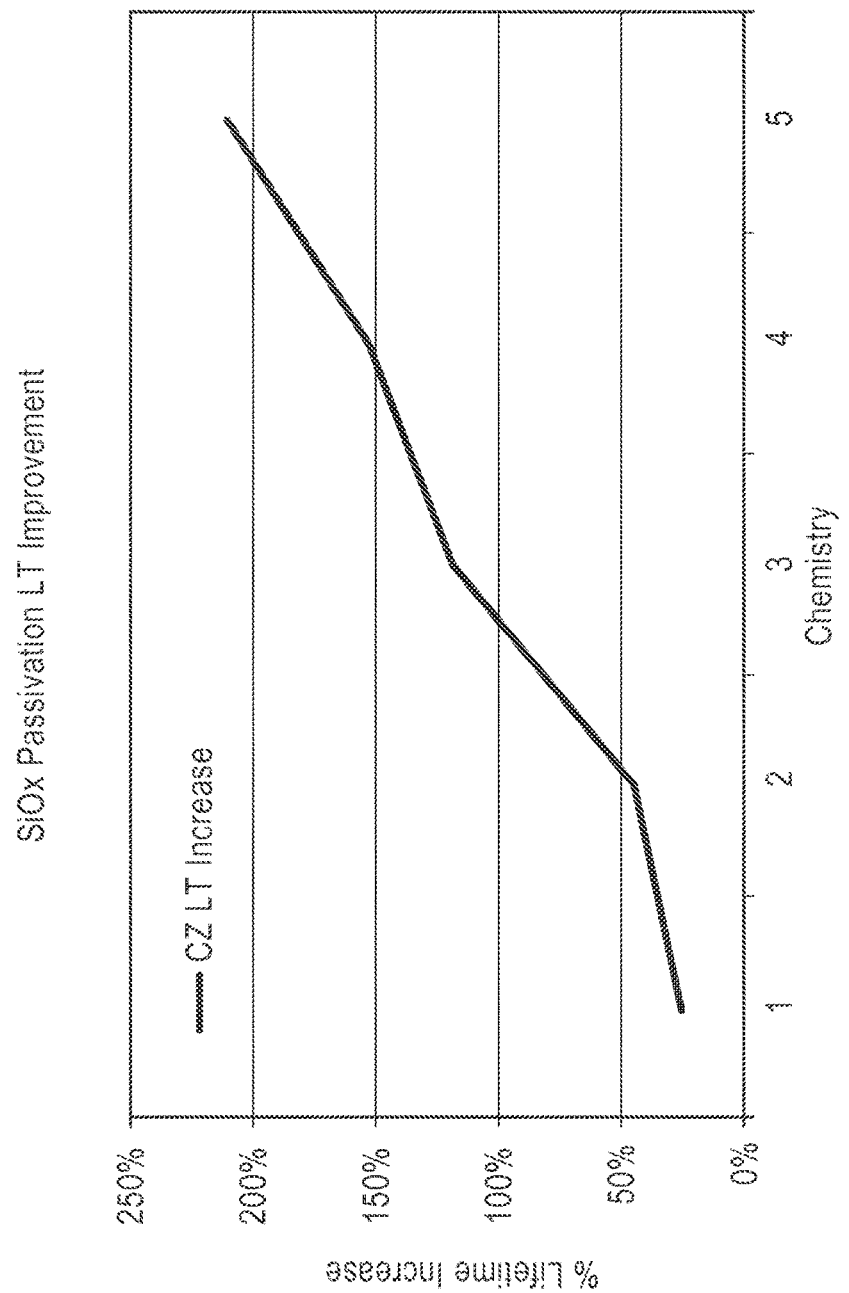
FIG. 8 shows a measurement of charge carrier lifetime improvement induced by an oxide layer created over the surface of a semiconductor device.

FIG. 8 shows a charge carrier lifetime improvement of solar cells fabricated using a method according to one exemplary embodiment. The comparison is made against baseline solar cells without oxide layers coated on the front and back side of silicon substrates. Lifetime improvement ranges from over 25% with the first RTWCG solution to over 200% with the fifth RTWCG solution.

Figure 9:
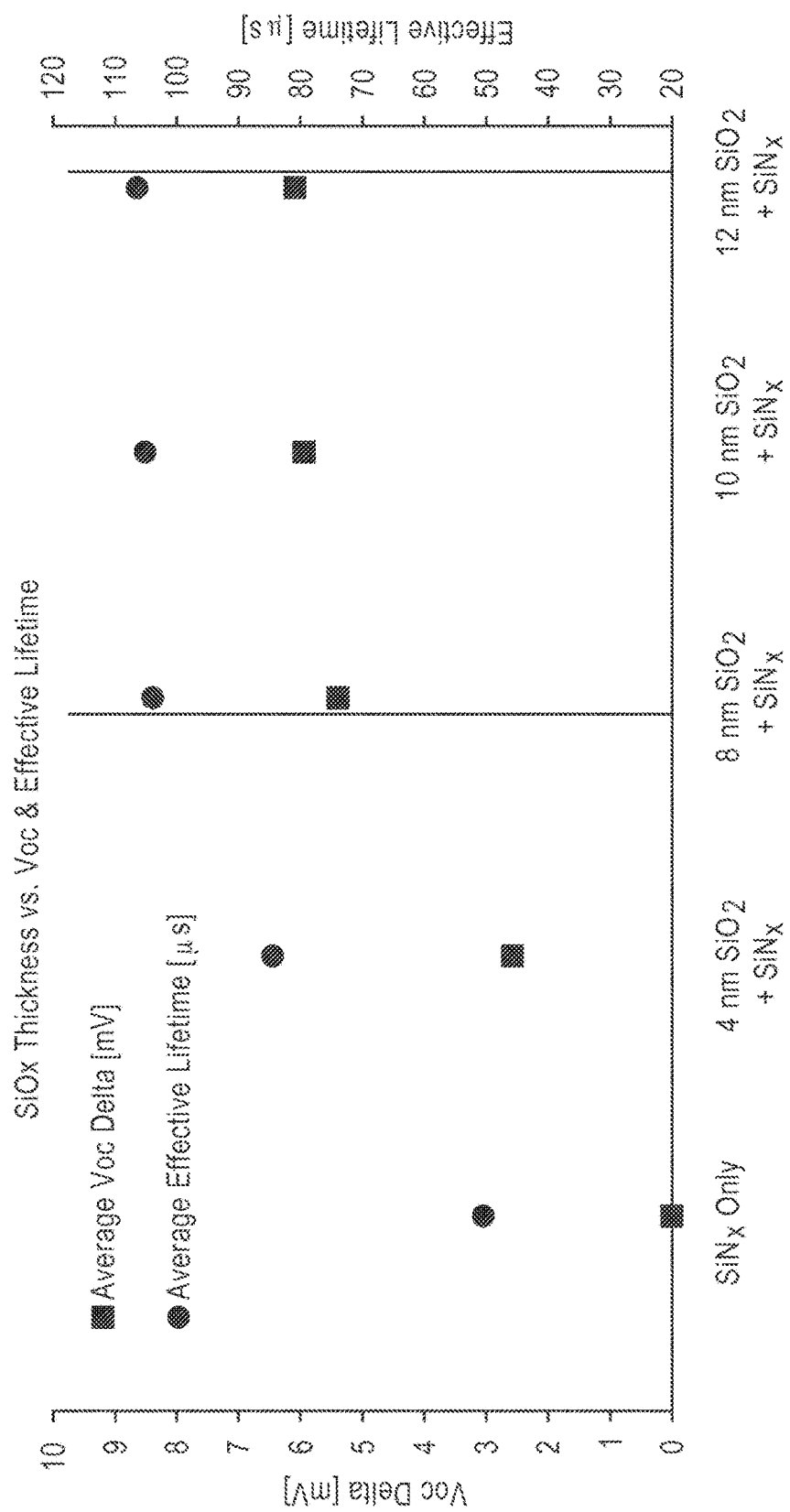
FIG. 9 shows measurements of open circuit voltage (Voc) and effective lifetime of charge carriers of a solar cell fabricated via a method like the one shown in FIG. 6.

FIG. 9 shows measurements of open circuit voltage (Voc) and effective lifetime of charge carriers of sample solar cells with both $SiO_2$ and SiNx layers. The SiNx layer has a thickness of 80 nm, while different thickness of $SiO_2$ layer is used here to illustrate the passivation effect. The passivation effect, indicated by effective lifetime of charge carriers, reaches a plateau when the thickness of the $SiO_2$ layer exceeds 8 nm. Similarly, the open circuit voltage also reaches a plateau at substantially similar thickness. This observation may indicate that passivation effect and efficient improvement effect of the $SiO_2$ layer can saturate above a certain threshold thickness. In this exemplary plot, the threshold thickness is around 8 nm.

Figure 10:
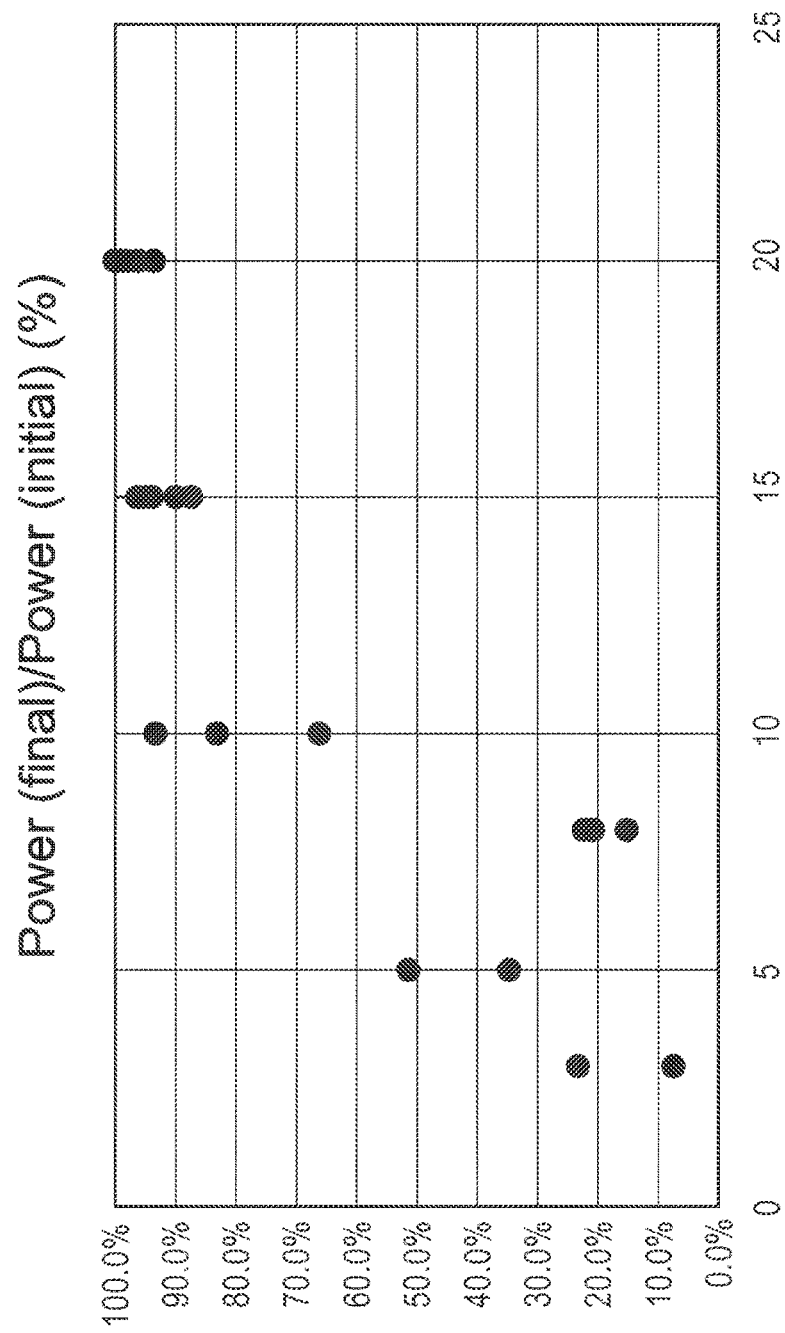
FIG. 10 shows measurements of a ratio between the final output power of a solar cell after a stressing test and the initial output power before any test. The solar cell is fabricated via a method like the one shown in FIG. 6.

FIG. 10 shows a measurement of PID mitigation effect induced by $SiO_2$ layers on the front and back side of silicon substrates in sample solar cells. The measurement is taken in an accelerated stressing test, in which the samples are baked in chambers at 85° C. and 85% humidity over an extended period of time to monitor their output power relative to initial output power before the baking. The ration of final output power to initial output power indicates the stability of solar cell operation over time and therefore can indicate the mitigation effect of PID, which constitutes one source of power degradation. FIG. 9 shows that, in general, thicker $SiO_2$ layer can lead to higher power ratio and accordingly better mitigation effect, until the thickness reaches a threshold value. In this exemplary embodiment, the threshold thickness for PID mitigation is around 10 nm.

Figure 11:
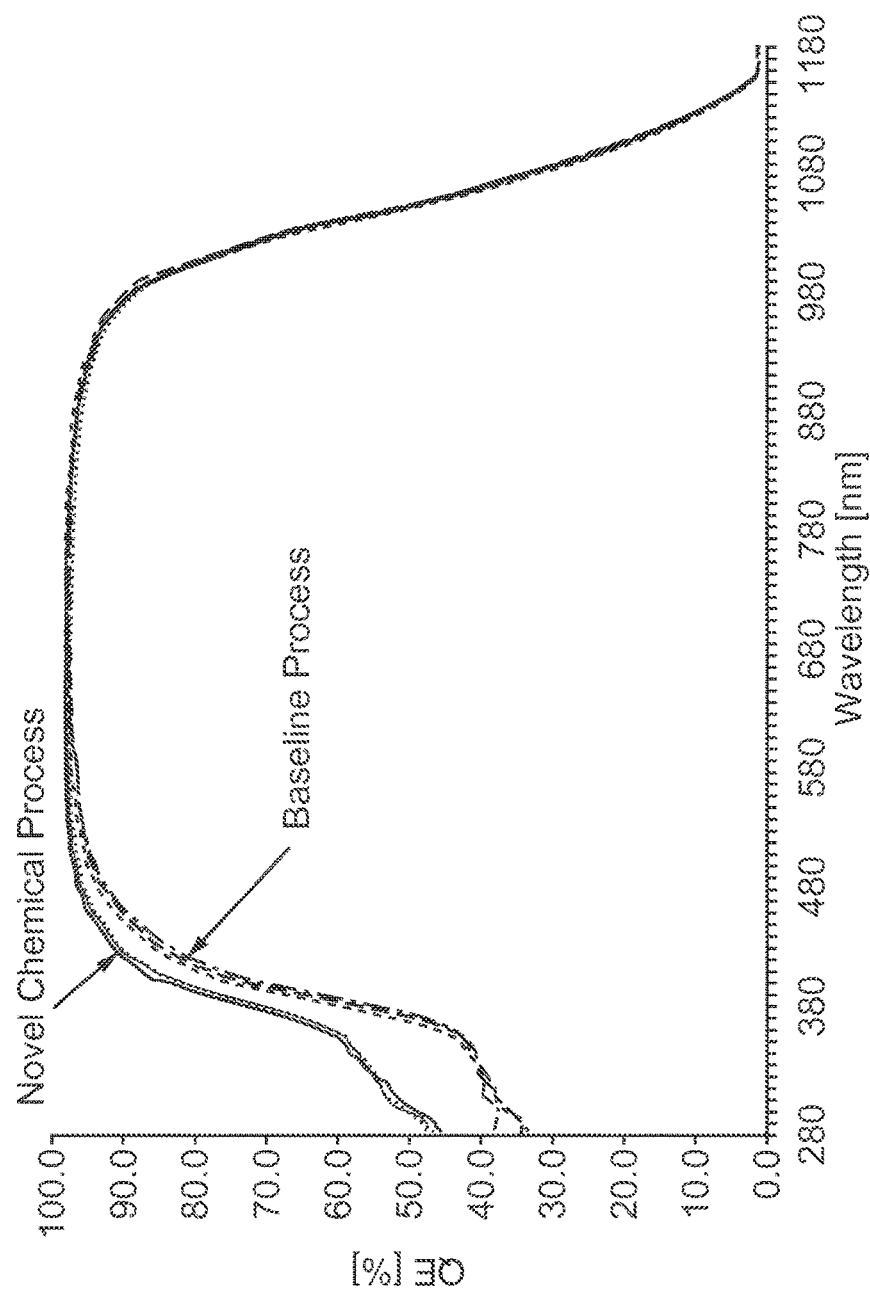
FIG. 11 shows a measurement of quantum efficiency (QE) of a solar cell fabricated via a method like the one shown in FIG. 6. A baseline sample without any oxide passivation layer is included in the figure for comparison.

FIG. 11 shoes a quantum efficiency (QE) measurement of sample solar cells with SiOx layers relative to baseline cells without SiOx layers. The QE can be defined as the ratio of the number of carriers collected by the solar cell to the number of photons of a given energy incident on the solar cell. The quantum efficiency may be given as a function of wavelength. As shown in FIG. 10, the SiOx film formed from the RTWCG processes facilitate greater QE in the wavelengths around 600 nm and below, with lower reflectance in blue/UV wavelengths.

Figure 12:
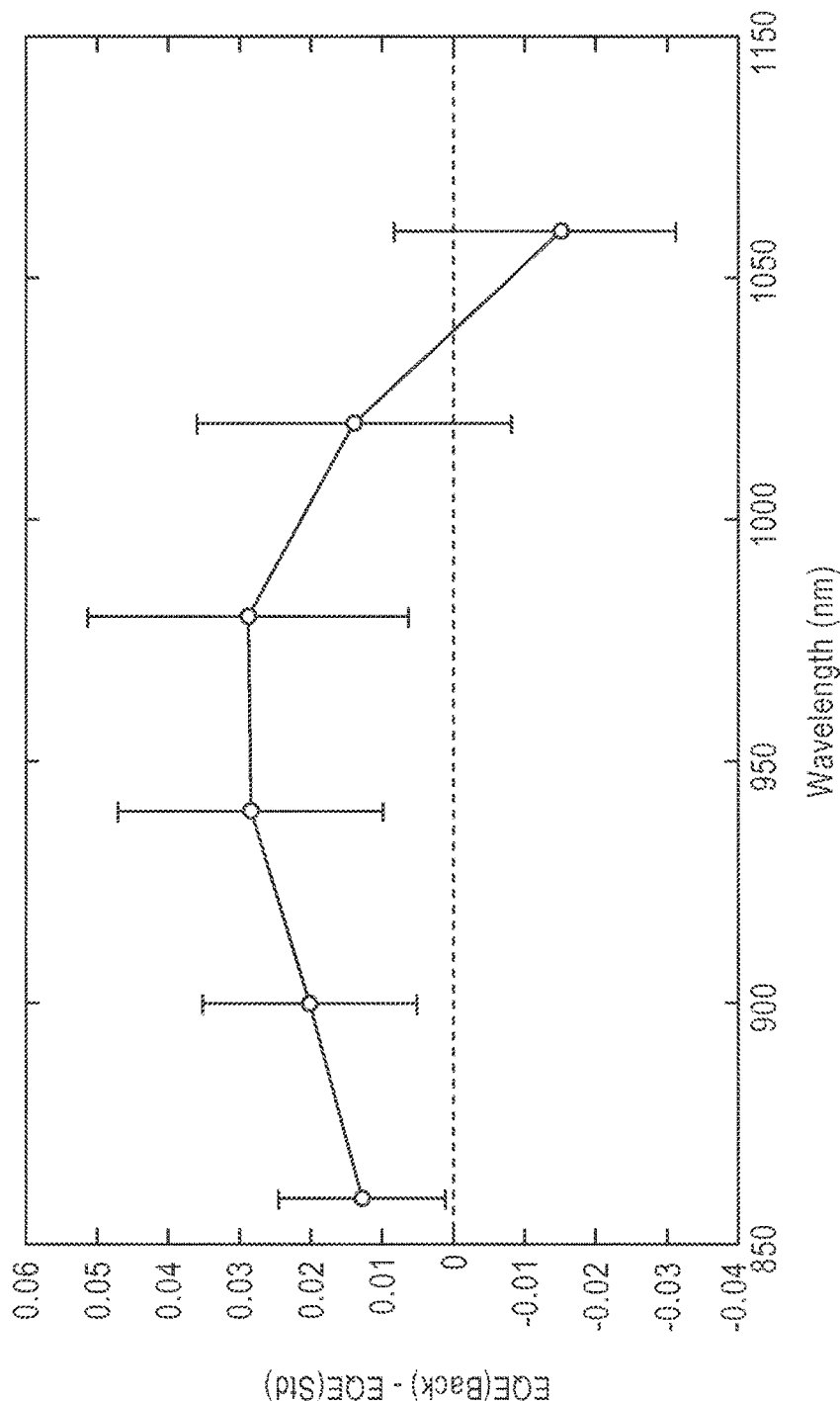
FIG. 12 shows a measurement of effective quantum efficiency (EQE) at wavelengths between 850 nm and 1100 nm.

FIG. 12 shows a measurement of external quantum efficiency (EQE) improvement of solar cells with back passivated solar cell samples. The EQE of a silicon solar cell includes the effect of optical losses such as transmission and reflection Improvement of EQE occurs at a wavelength range between 850 nm and 1050 nm in this exemplary embodiment.

Figure 13:
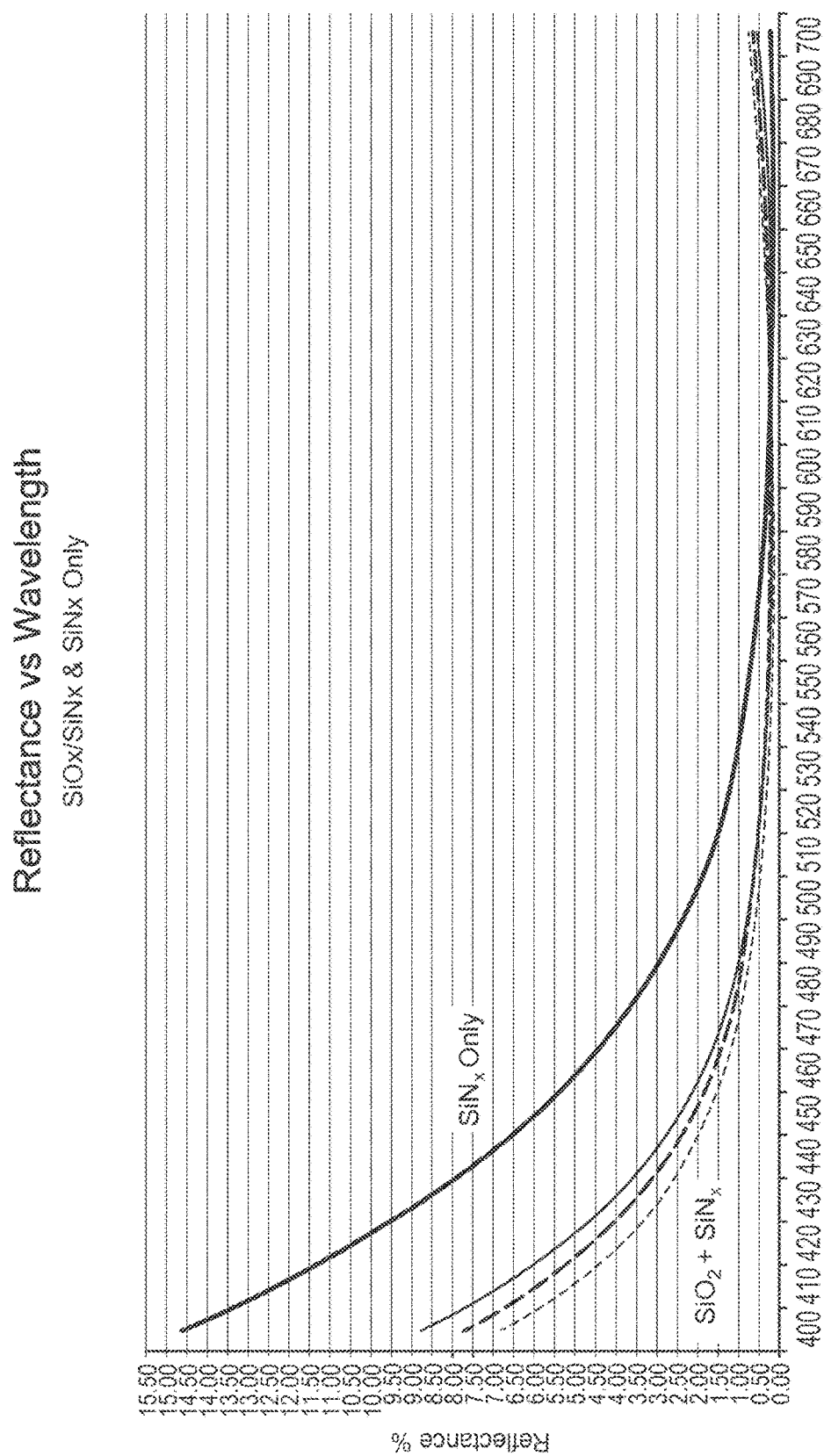
FIG. 13 shows a measurement of reflectance with respect to wavelengths of a solar cell having a combination oxide layer and SiNx layer over the front surface. A baseline sample having only SiNx layer is included for comparison.

FIG. 13 shows measurements of different surface reflection of solar cells with only SiNx ARC layers and with combination of SiNx and SiOx layers. The SiOx layers tend to reduce reflectance in the "blue" wavelengths (below about 500 nm). The reflectance in the "red" wavelengths is increased slightly, but AWR remains lower for the SiOx layers formed using RTWCG processes. The SiNx layer can be fabricated to have a refractive index of about 2.1 to 2.2.

Figure 14:
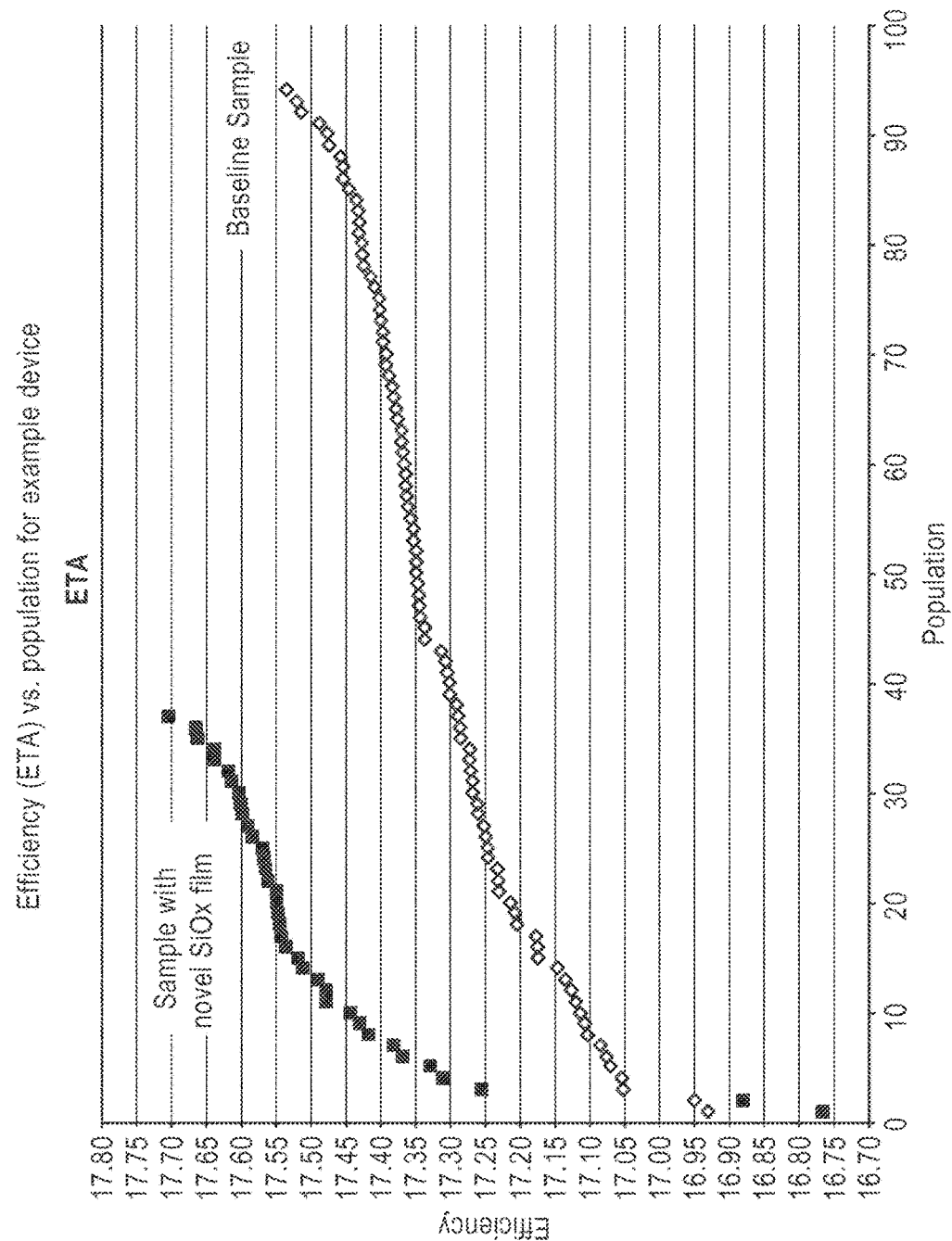
FIG. 14 shows efficiency measurement of solar cells fabricated using a method according to one exemplary embodiment.
Figure 15:
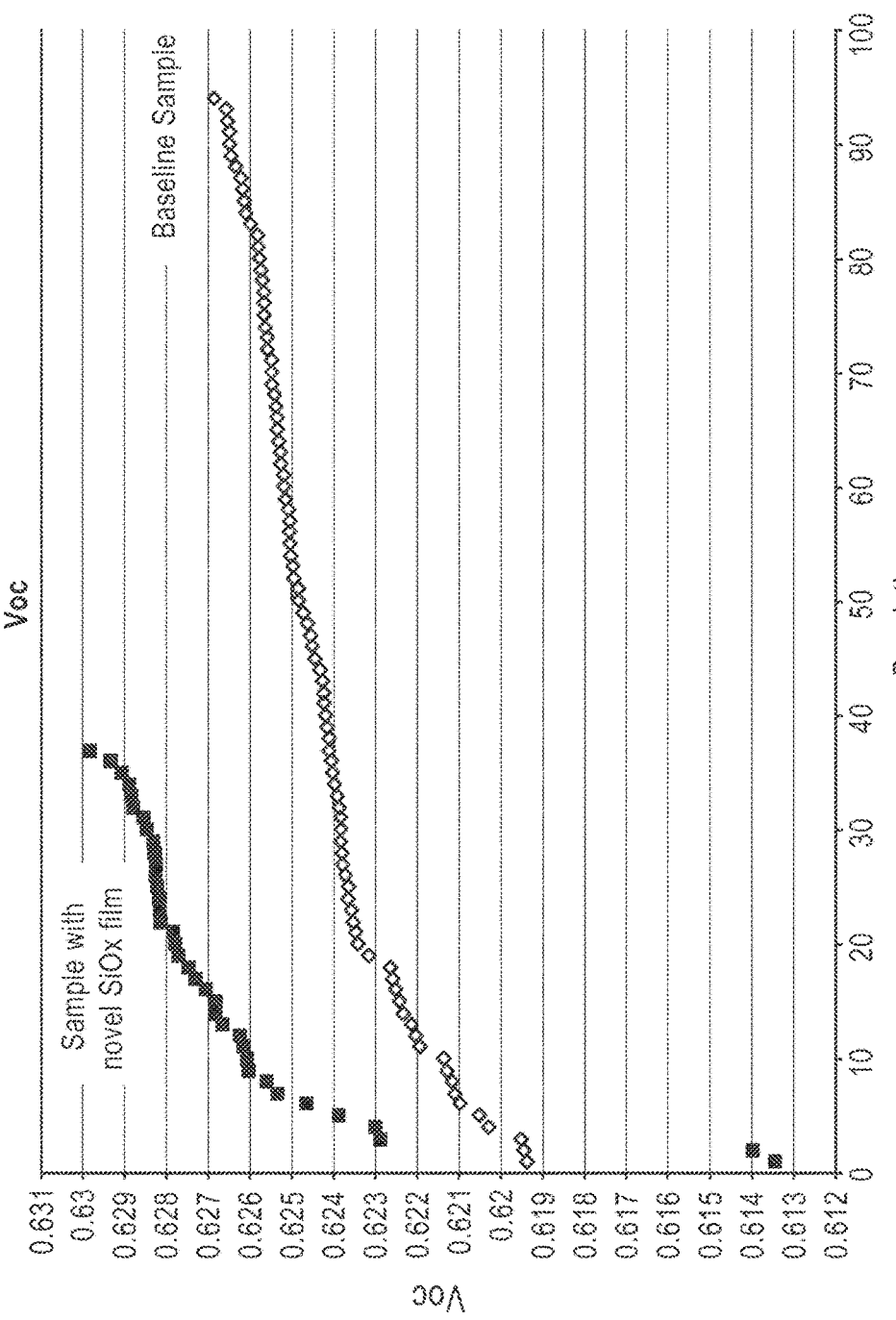
FIG. 15 shows an open circuit voltage measurement of solar cells fabricated using a method according to one exemplary embodiment.
Figure 16:
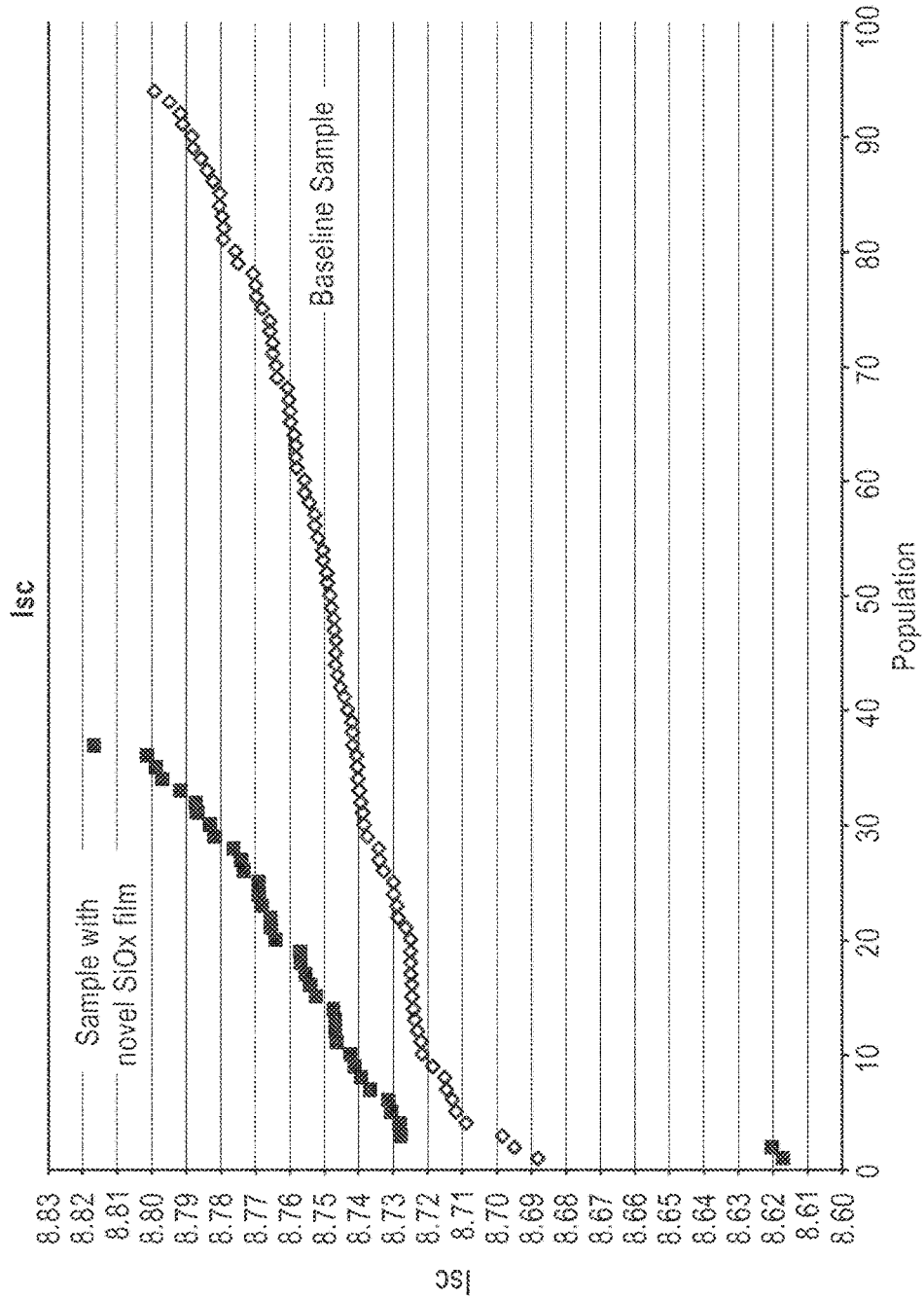
FIG. 16 shows a short circuit current measurement of solar cells fabricated using a method according to one exemplary embodiment.
Figure 17:
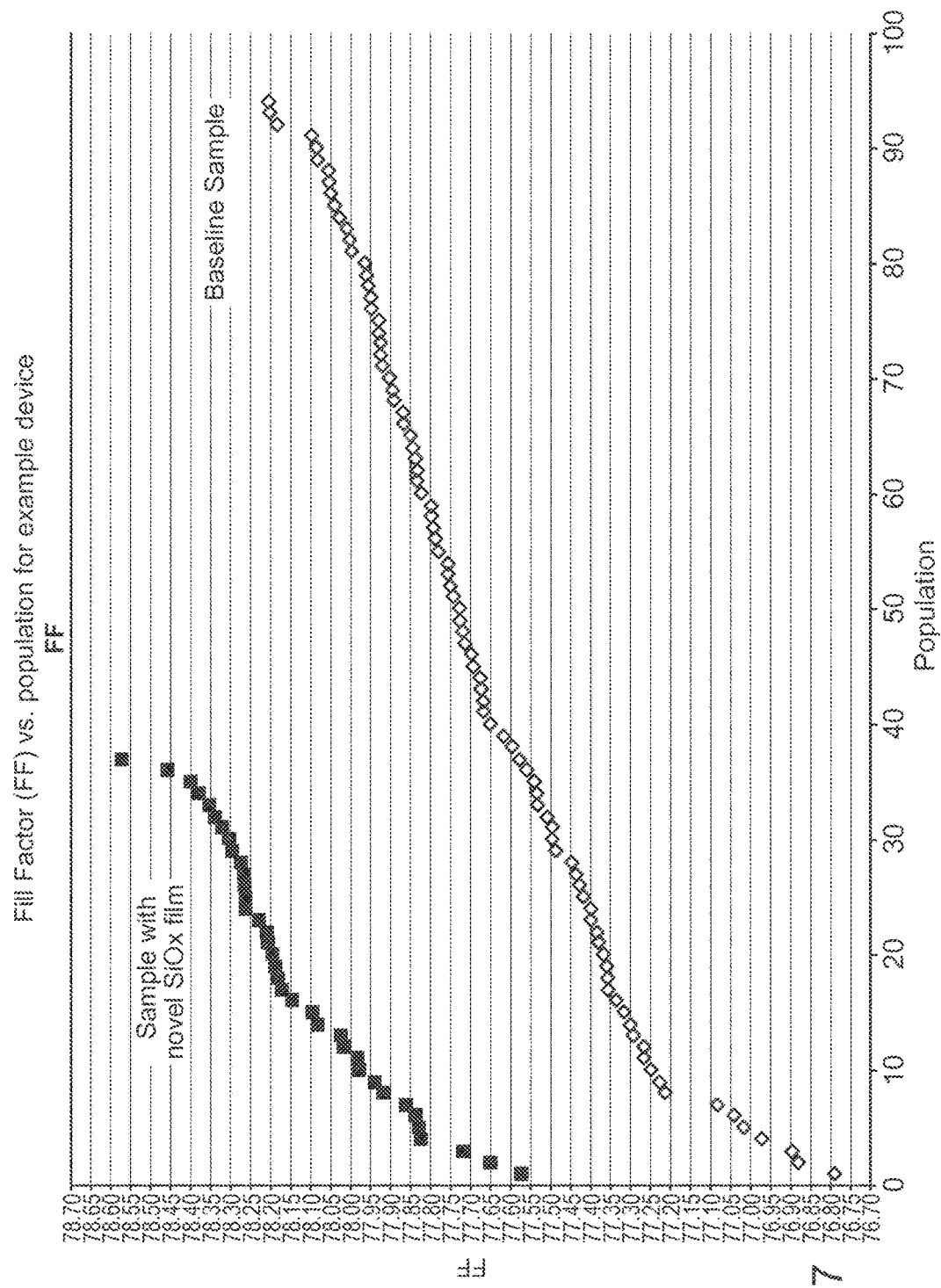
FIG. 17 shows a fill factor (FF) measurement of solar cells fabricated using a method according to one exemplary embodiment.

FIG. 14-17 show measurements of solar cell efficiency, open circuit voltage, short circuit current, and fill factor (FF) of solar cells fabricated according to exemplary embodiments of the invention. A baseline example without any SiOx layer is used for comparison. FIG. 14 shows that the solar cell conversion efficiency from solar energy to electrical energy can be increased, for example, from 17.3% to 17.7% by including SiOx layers for passivation, ARC, and surface texturing. Note that a fraction of percentage improvement of efficiency can result in significant competitive advantage across hundreds of solar cells and modules. FIG. 15 and FIG. 16 show that the SiOx layer can improve the open circuit voltage from about 0.624 Volts to about 0.63 Volts and increase the short circuit current (Isc) from 8.74 mA to 8.82 mA, respectively. Fill factor (FF), which can determine the maximum power from a solar cell, can also be enhanced, for example, from 77.65 to about 78.6 by adding a SiOx layer as shown in FIG. 17.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of designing and making the coupling structures and diffractive optical elements disclosed herein may be implemented using hardware, software or a combination thereof. When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer. Additionally, a computer may be embedded in a device not generally regarded as a computer but with suitable processing capabilities, including a Personal Digital Assistant (PDA), a smart phone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes (e.g., of designing and making the coupling structures and diffractive optical elements disclosed above) outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A method of facilitating fabrication of a passivated emitter and rear solar cell (PERC) via a room temperature wet chemical growth (RTWCG) process using a junction isolation and phosphosilicate glass (PSG)/borosilicate glass (BSG) etch solar cell processing tool, the method comprising:

(A) placing a first RTWCG solution in a first reservoir coupled to a junction isolation process tank through a first chemical dosing unit of the processing tool;

(B) placing at least a portion of a semiconductor substrate for the PERC in the junction isolation process tank and allowing contact in the junction isolation process tank between the portion of the semiconductor substrate and the first RTWCG solution so as to facilitate growth of a back side oxide passivation layer on a back side of the semiconductor substrate and thereby provide a back side passivated substrate, wherein the first RTWCG solution in the junction isolation process tank is delivered from the first reservoir by the first chemical dosing unit;

(C) rinsing the back side passivated substrate in a first rinse tank of the processing tool using de-ionized (DI) water so as to provide a rinsed back side passivated substrate;

(D) placing a second RTWCG solution in a second reservoir coupled to a PSG/BSG etch tank through a second chemical dosing unit of the processing tool;

(E) placing the rinsed back side passivated substrate in the PSG/BSG etch tank and allowing contact in the PSG/BSG etch tank between the rinsed back side passivated substrate and the second RTWCG solution so as to facilitate growth of a front side oxide passivation layer having a thickness of less than 50 nm on a front side of the substrate and thereby provide a front and back side passivated substrate, wherein the second RTWCG solution in the PSG/BSG etch tank is delivered from the second reservoir by the second chemical dosing unit; and (F) rinsing and drying the front and back side passivated substrate using a rinse and dry station coupled to the PSG/BSG etch tank.

2. The method of claim 1, wherein the junction isolation process tank is operably coupled to the first reservoir, the second reservoir, and a third reservoir of the processing tool; the first rinse tank is further coupled to a porous silicon etch tank operably coupled to a second rinse tank of the processing tool, wherein the method uses only one of the plurality of acid reservoirs coupled to the junction isolation process tank and does not use the combination of the second reservoir, the third reservoir, the porous silicon etch tank, and the second rinse tank of the processing tool for the fabrication of the PERC.

3. The method of claim 1, further comprising:

(G) doping the back side of the semiconductor substrate with a first doping material before facilitating growth of the back side oxide passivation layer on the back side of the semiconductor substrate in (B).

4. The method of claim 3, wherein the first doping material comprises at least one of boron, phosphorous, or gallium.

5. The method of claim 3, wherein (G) comprises at least one of a thermal diffusion process, an ion implantation process or a laser doping process.

6. The method of 1, further comprising:
(H) doping the front side of the semiconductor substrate with a second doping material before facilitating growth of the front side oxide passivation layer on the front side of the semiconductor substrate in (E).

7. The method of claim 6, wherein the second doping material comprises at least one of phosphorous, boron or gallium.

8. The method of claim 6, wherein (H) comprises at least one of a thermal diffusion process, an ion implantation process or a laser doping process.

9. The method of claim 1, further comprising:
depositing a silicon nitride layer over the front side oxide passivation layer via a plasma enhanced chemical vapor deposition (PECVD) process.

10. The method of claim 9, further comprising:
screen printing a plurality of metal contacts on the layer of silicon nitride, wherein the plurality of metal contacts comprises silver (Ag).

11. The method of claim 1, wherein (B) comprises:
(B1) creating a plurality of resist dots on the back side of the semiconductor substrate so as to provide a masked back side of the semiconductor substrate;
(B2) exposing the masked back side of the semiconductor substrate to the first RTWCG solution so as to facilitate growth of the back side oxide passivation layer on the back side of the semiconductor substrate;
(B3) removing the plurality of resist dots so as to provide a back side passivated substrate, wherein at least a portion of the back side of the semiconductor substrate is not covered by the back side oxide passivation layer.

12. The method of claim 11, further comprising:
screen printing a plurality of non-fire through metal contacts over the back side oxide passivation layer, wherein the plurality of non-fire through metal contacts comprises at least one of aluminum (Al) and silver (Ag), and at least one metal contact of the plurality of non-fire through metal contacts is in electrical contact with the back side of the semiconductor substrate.

13. The method of claim 1, where (B) further comprises:
creating at least one aperture on the back side oxide passivation layer via a laser drilling process.

14. The method of claim 13, further comprising:
screen printing a plurality of non-fire through metal contacts over the back side oxide passivation layer, wherein the plurality of non-fire through metal contacts comprises at least one of aluminum (Al) and silver (Ag), and at least one metal contact of the plurality of non-fire through metal contacts is in electrical contact with the back side of the semiconductor substrate through the at least one aperture.

15. The method of claim 1, further comprising:
doping the back side of the semiconductor substrate at a plurality of spots before facilitating growth of the back side oxide passivation layer on the back side of the semiconductor substrate; and
screen printing a plurality of metal contacts, wherein at least one doping spot is in electrical communication with at least one metal contact so as to facilitate fabricating a passivated emitter with rear locally diffused (PERL) cell.

16. The method of claim 1, wherein at least one of the back side oxide passivation layer and the front side oxide passivation layer has a first refractive index on an inner surface and a second refractive index on an outer surface, the inner surface being closer to the semiconductor substrate than the outer surface and the first refractive index being greater than the second refractive index.

17. The method of claim 1, wherein the semiconductor substrate comprises silicon and at least one of the first RTWCG solution and the second RTWCG solution comprise:
a first percentage of an iodine containing compound;
a second percentage of a fluoride containing acid;
a third percentage of non-oxidizing acid; and
a fourth percentage of water.

18. The method of claim 17, wherein:
the first percentage is about 0.01% to about 0.4%;
the second percentage is about 0.1% to about 10%;
the third percentage is about 1% to about 50%; and
the fourth percentage is about 40% to about 99%.

19. The method of claim 17, wherein the ratio of the second percentage to the third percentage is within a range from approximately 1/20 to approximately 4.

20. The method of claim 17, wherein the fourth percentage is within a range from approximately 80% to approximately 98%.

21. The method of claim 17, wherein the iodine containing compound comprises one or more of $HIO_3$, $I_2O_5$, HI, KI, $BI_3$, $I_2O_4$, $I_2O_9$, $IF_5$, $SiI_4$, $PI_3$, $P_2I_4$, $TiI_4$, $VI_3$, $CoI_2$, $NiI_e$, $AsI_3$, $SnI_4$, $SbI_3$, $TeI_4$, $PbI_2$, and $BiI_3$.

22. The method of claim 17, wherein the fluoride containing acid comprises at least one of HF, $H_2SiF_6$, $NH_4F$, $H_2TiF_6$, BaF, BF4, and NaF.

23. The method of claim 17, wherein the non-oxidizing acid comprises one or more of HCl, HI, HBr, HF, and $H_3PO_4$.

24. The method of claim 1, wherein the semiconductor substrate is a silicon substrate and at least one of the first RTWCG solution and the second RTWCG solution comprise:
aqueous hydrofluoric acid ($HF_{(aq)}$) having a concentration ranging from 2% to 50% to facilitate etching of the silicon substrate;
iodine pentoxide ($I_2O_5$) dissolved in the aqueous hydrofluoric acid, the iodine pentoxide having a concentration ranging from 0.3 grams per liter (g/L) to 2 grams per liter (g/L) of the aqueous hydrofluoric acid, to promote an oxidation reaction at a surface of the silicon substrate and thereby facilitate growing of the silicon-containing oxide layer on the silicon substrate; and a non-invasive additive to control a balance between a first rate of the etching of the silicon substrate and a second rate of the growing of the silicon-containing oxide layer.

25. The method of claim 24, wherein the non-invasive additive is selected from $NH_4F$, HF, HCl, $H_2O$, $HNO_3$ and $H_2O_2$.

26. The method of claim 1, wherein at least one of the first RTWCG solution and the second RTWCG solution is substantially free of silicon.

27. The method of claim 1, wherein the first RTWCG solution comprises a boron source selected from the group consisting of $H_3BO_4$, $B_2O_3$, $BI_3$ or $B_2O_3$ so as to form a boron-containing back side oxide passivation layer.

28. The method of claim 1, wherein the first RTWCG solution and the second RTWCG solution comprise substantially similar compositions.

29. The method of claim 1, further comprising:
(K3) tuning an operation temperature of the solar cell processing tool during at least one of (B) or (E) so as to achieve a variable oxide layer growth speed.

* * * * *